(12) United States Patent
Sparrow

(10) Patent No.: US 11,558,069 B1
(45) Date of Patent: Jan. 17, 2023

(54) CONVERSION OF PAULI ERRORS TO ERASURE ERRORS IN A PHOTONIC QUANTUM COMPUTING SYSTEM

(71) Applicant: PsiQuantum Corp., Palo Alto, CA (US)

(72) Inventor: Christopher J. Sparrow, Palo Alto, CA (US)

(73) Assignee: PsiQuantum Corp., Palo Alto, CA (US)

(*) Notice: Subject to any disclaimer, the term of this patent is extended or adjusted under 35 U.S.C. 154(b) by 616 days.

(21) Appl. No.: 16/570,460

(22) Filed: Sep. 13, 2019

Related U.S. Application Data

(60) Provisional application No. 62/824,587, filed on Mar. 27, 2019, provisional application No. 62/730,949, filed on Sep. 13, 2018.

(51) Int. Cl.

| | |
|---|---|
| *H01L 29/06* | (2006.01) |
| *H01L 29/08* | (2006.01) |
| *H01L 31/0256* | (2006.01) |
| *H01L 39/22* | (2006.01) |
| *H03M 13/00* | (2006.01) |
| *G06F 17/12* | (2006.01) |
| *B82Y 10/00* | (2011.01) |
| *G06N 10/00* | (2022.01) |

(Continued)

(52) U.S. Cl.
CPC ........... *H03M 13/611* (2013.01); *B82Y 10/00* (2013.01); *G06F 17/12* (2013.01); *G06N 10/00* (2019.01); *G06N 10/70* (2022.01); *H03M 13/154* (2013.01)

(58) Field of Classification Search
CPC .............. H03M 13/611; H03M 13/154; G06F 17/12; B82Y 10/00; G06N 10/00
See application file for complete search history.

(56) References Cited

U.S. PATENT DOCUMENTS

| | | | |
|---|---|---|---|
| 6,678,450 B1* | 1/2004 | Franson | B82Y 10/00 |
| | | | 359/326 |
| 2019/0164034 A1* | 5/2019 | Gambetta | G06N 10/00 |

(Continued)

OTHER PUBLICATIONS

Carolan, Jacques, et al., "Universal linear optics", Science, vol. 349(6249):711-716, Aug. 14, 2015.

(Continued)

*Primary Examiner* — Samir W Rizk
(74) *Attorney, Agent, or Firm* — Kowert, Hood, Munyon, Rankin & Goetzel, P.C.

(57) ABSTRACT

A quantum computing system for converting Pauli errors of one or more qubits to erasure errors in a photonic quantum computing architecture. Two or more photonic qubits may be input to a quantum computing system, where at least one first qubit of the two or more qubits has experienced a Pauli error. A sequence of linear optical circuitry operations may be performed on the two or more qubits to generate two or more modified qubits, wherein the sequence of operations transforms one or more of the first qubits from a logical subspace of a Fock space to an erasure subspace of the Fock space. A cluster state for universal quantum computing may be generated from the two or more modified qubits using probabilistic entangling gates. A quantum computational algorithm may be performed using the quantum cluster state generated from the two or more modified qubits.

21 Claims, 20 Drawing Sheets

(51) Int. Cl.
H03M 13/15 (2006.01)
G06N 10/70 (2022.01)

(56) References Cited

U.S. PATENT DOCUMENTS

| | | | |
|---|---|---|---|
| 2019/0332731 A1* | 10/2019 | Chen | G06F 30/20 |
| 2021/0065037 A1* | 3/2021 | Wiebe | G06N 3/08 |
| 2021/0174235 A1* | 6/2021 | Kues | G02F 1/00 |
| 2021/0263753 A1* | 8/2021 | Gunlycke | G06F 9/44505 |

OTHER PUBLICATIONS

Pan, Jian-Wei, et al., "Experimental entanglement purification of arbitrary unknown states", Nature, vol. 423:417-422, May 22, 2003.

* cited by examiner

Key:

| 50:50 beamsplitter with phase flip on white circled mode: | π phase shifter: | Modes defining a qubit: | modeswap: | classical measurement of mode: |
|---|---|---|---|---|
|  |  |  |  |  |
| 402 | 404 | 406 | 408 | 410 |

Modeswap M

Logical-to-erasure Converter T

Logical-to-erasure Converter with
classical measurement

Standard BSG Circuit

Compact BSG Circuit Equivalent to Standard
with Conversion circuit $H_o$ Applied Boosted BSG Circuit with
Improved Error Rates BSG Circuit including HOM Detection for
Improved Distinquishability Tolerance Scheme for purification of Bell states with partial-distinguishability errors. A qubit each from two noisy Bell states are subject to a rotated Type-II fusion, followed by a modeswap

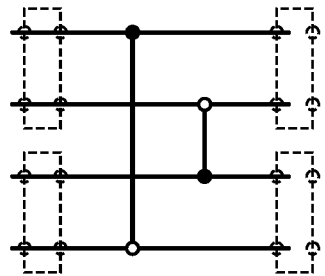

$$|\phi^+\rangle = \frac{1}{\sqrt{2}}(|00\rangle + |11\rangle)$$

$$T_{\phi^+} = \begin{pmatrix} \frac{1}{\sqrt{2}} & 0 & 0 & \frac{1}{\sqrt{2}} \\ 0 & -\frac{1}{\sqrt{2}} & \frac{1}{\sqrt{2}} & 0 \\ 0 & \frac{1}{\sqrt{2}} & \frac{1}{\sqrt{2}} & 0 \\ \frac{1}{\sqrt{2}} & 0 & 0 & -\frac{1}{\sqrt{2}} \end{pmatrix}$$

FIG. 15A

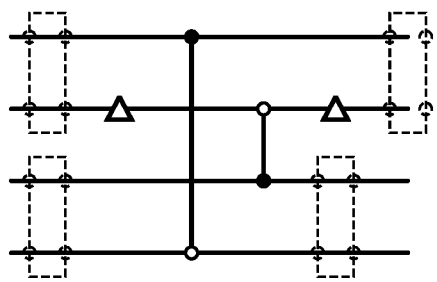

$$|\phi^-\rangle = \frac{1}{\sqrt{2}}(|00\rangle - |11\rangle)$$

$$T_{\phi^-} = \begin{pmatrix} \frac{1}{\sqrt{2}} & 0 & 0 & \frac{1}{\sqrt{2}} \\ 0 & -\frac{1}{\sqrt{2}} & -\frac{1}{\sqrt{2}} & 0 \\ 0 & -\frac{1}{\sqrt{2}} & \frac{1}{\sqrt{2}} & 0 \\ \frac{1}{\sqrt{2}} & 0 & 0 & -\frac{1}{\sqrt{2}} \end{pmatrix}$$

FIG. 15B

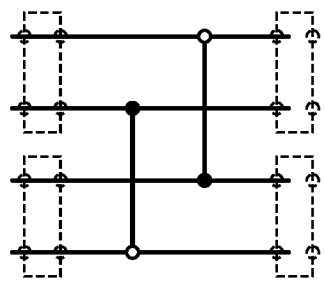

$$|\psi^+\rangle = \frac{1}{\sqrt{2}}(|01\rangle + |10\rangle)$$

$$T_{\psi^+} = \begin{pmatrix} -\frac{1}{\sqrt{2}} & 0 & \frac{1}{\sqrt{2}} & 0 \\ 0 & \frac{1}{\sqrt{2}} & 0 & \frac{1}{\sqrt{2}} \\ \frac{1}{\sqrt{2}} & 0 & \frac{1}{\sqrt{2}} & 0 \\ 0 & \frac{1}{\sqrt{2}} & 0 & -\frac{1}{\sqrt{2}} \end{pmatrix}$$

FIG. 15C $$|\psi^-\rangle = \frac{1}{\sqrt{2}}(|01\rangle - |10\rangle)$$

$$T_{\psi^-} = \begin{pmatrix} -\frac{1}{\sqrt{2}} & 0 & \frac{1}{\sqrt{2}} & 0 \\ 0 & \frac{1}{\sqrt{2}} & 0 & -\frac{1}{\sqrt{2}} \\ \frac{1}{\sqrt{2}} & 0 & \frac{1}{\sqrt{2}} & 0 \\ 0 & -\frac{1}{\sqrt{2}} & 0 & -\frac{1}{\sqrt{2}} \end{pmatrix}$$

,

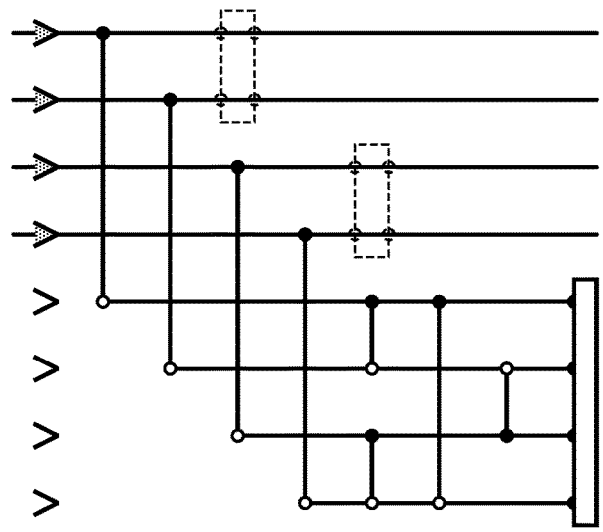

$$T_{\text{bsg standard}} = \begin{pmatrix} \frac{1}{\sqrt{2}} & 0 & 0 & 0 & \frac{1}{\sqrt{2}} & 0 & 0 & 0 \\ 0 & \frac{1}{\sqrt{2}} & 0 & 0 & 0 & \frac{1}{\sqrt{2}} & 0 & 0 \\ 0 & 0 & \frac{1}{\sqrt{2}} & 0 & 0 & 0 & \frac{1}{\sqrt{2}} & 0 \\ 0 & 0 & 0 & \frac{1}{\sqrt{2}} & 0 & 0 & 0 & \frac{1}{\sqrt{2}} \\ \frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & -\frac{1}{2\sqrt{2}} & -\frac{1}{2\sqrt{2}} & \frac{1}{2\sqrt{2}} \\ -\frac{1}{2\sqrt{2}} & \frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & -\frac{1}{2\sqrt{2}} & -\frac{1}{2\sqrt{2}} \\ \frac{1}{2\sqrt{2}} & -\frac{1}{2\sqrt{2}} & \frac{1}{2\sqrt{2}} & \frac{1}{2\sqrt{2}} & -\frac{1}{2\sqrt{2}} & \frac{1}{2\sqrt{2}} & -\frac{1}{2\sqrt{2}} & -\frac{1}{2\sqrt{2}} \\ \frac{1}{2\sqrt{2}} & \frac{1}{2\sqrt{2}} & -\frac{1}{2\sqrt{2}} & \frac{1}{2\sqrt{2}} & -\frac{1}{2\sqrt{2}} & -\frac{1}{2\sqrt{2}} & \frac{1}{2\sqrt{2}} & -\frac{1}{2\sqrt{2}} \end{pmatrix}$$

*FIG. 15H*

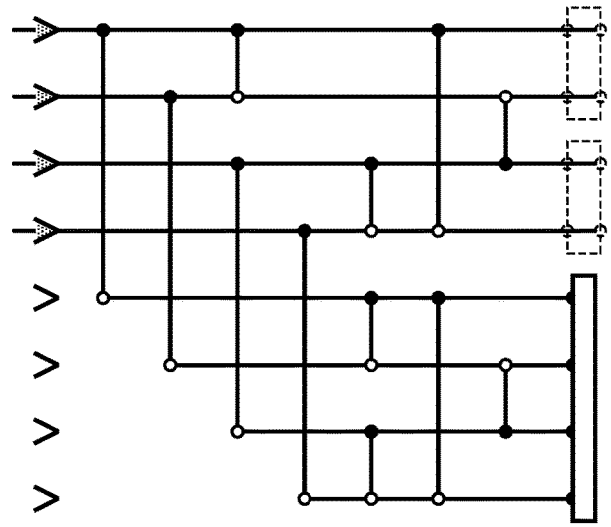

$$T_{bsg\ conversion} = \begin{pmatrix} \frac{1}{2\sqrt{2}} & \frac{1}{2\sqrt{2}} & \frac{1}{2\sqrt{2}} & -\frac{1}{2\sqrt{2}} & \frac{1}{2\sqrt{2}} & \frac{1}{2\sqrt{2}} & \frac{1}{2\sqrt{2}} & -\frac{1}{2\sqrt{2}} \\ -\frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & \frac{1}{2\sqrt{2}} & \frac{1}{2\sqrt{2}} & \frac{1}{2\sqrt{2}} \\ \frac{1}{2\sqrt{2}} & -\frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & \frac{1}{2\sqrt{2}} & \frac{1}{2\sqrt{2}} \\ \frac{1}{2\sqrt{2}} & \frac{1}{2\sqrt{2}} & -\frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & \frac{1}{2\sqrt{2}} \\ \frac{1}{2\sqrt{2}} & \frac{1}{2\sqrt{2}} & \frac{1}{2\sqrt{2}} & -\frac{1}{2\sqrt{2}} & -\frac{1}{2\sqrt{2}} & -\frac{1}{2\sqrt{2}} & -\frac{1}{2\sqrt{2}} & \frac{1}{2\sqrt{2}} \\ -\frac{1}{2\sqrt{2}} & \frac{1}{2\sqrt{2}} & \frac{1}{2\sqrt{2}} & \frac{1}{2\sqrt{2}} & \frac{1}{2\sqrt{2}} & -\frac{1}{2\sqrt{2}} & -\frac{1}{2\sqrt{2}} & -\frac{1}{2\sqrt{2}} \\ \frac{1}{2\sqrt{2}} & -\frac{1}{2\sqrt{2}} & \frac{1}{2\sqrt{2}} & \frac{1}{2\sqrt{2}} & -\frac{1}{2\sqrt{2}} & \frac{1}{2\sqrt{2}} & -\frac{1}{2\sqrt{2}} & -\frac{1}{2\sqrt{2}} \\ \frac{1}{2\sqrt{2}} & \frac{1}{2\sqrt{2}} & -\frac{1}{2\sqrt{2}} & \frac{1}{2\sqrt{2}} & -\frac{1}{2\sqrt{2}} & -\frac{1}{2\sqrt{2}} & \frac{1}{2\sqrt{2}} & -\frac{1}{2\sqrt{2}} \end{pmatrix}$$

CONVERSION OF PAULI ERRORS TO ERASURE ERRORS IN A PHOTONIC QUANTUM COMPUTING SYSTEM

PRIORITY CLAIM

This application claims priority to U.S. Provisional Patent Application No. 62/730,949, titled "Pauli-to-Erasure Converters for Error Suppression in a Quantum Computer" and filed on Sep. 13, 2018, and U.S. Provisional Patent Application No. 62/824,587, titled "Conversion of Pauli Errors to Erasure Errors in a Photonic Quantum Computing System" and filed on Mar. 27, 2019, which are both hereby incorporated by reference in their entirety, as though fully and completely set forth herein.

TECHNICAL FIELD

Embodiments herein relate generally to quantum computational devices, such as photonic devices (or hybrid electronic/photonic devices) for generating entangled photonic states (e.g., as resources for quantum computing, quantum computation, quantum metrology, and other quantum information processing tasks) and performing quantum computational algorithms using said entangled states.

BACKGROUND

One of the main barriers to widespread use of quantum technologies, such as quantum computing, quantum communications, and the like is the ability to reliably generate entanglement between two or more physical quantum systems, e.g., between two or more qubits. In the specific case of quantum computation, many quantum computing algorithms require cluster states of multiple qubits, or, more generally, graph states. A graph state is a highly entangled multi-qubit state that may be represented visually as a graph with nodes representing qubits and edges representing entanglement between the qubits. However, various problems that either inhibit the generation of entangled states or destroy the entanglement once created (e.g., such as decoherence) have frustrated advancements in quantum technologies that rely on the use of highly entangled quantum states. Furthermore, in some qubit architectures, e.g., photonic architectures, the generation of entangled states of multiple qubits is an inherently probabilistic process that may have a low probability of success. For example, current methods for producing Bell states from single photons have success probabilities of around 20% (corresponding to an 80% failure rate). Accordingly, there remains a need for improved systems and methods for producing and/or maintaining entangled states.

SUMMARY

Some embodiments described herein include quantum computing devices, systems and methods for converting Pauli errors of one or more qubits to erasure errors in a photonic quantum computing architecture.

In some embodiments, two or more photonic qubits may be input to a quantum computing system, where at least one first qubit of the two or more qubits has experienced a Pauli error. A sequence of linear optical circuitry operations may be performed on the two or more qubits to generate two or more modified qubits, wherein the sequence of operations transforms one or more of the first qubits from a logical subspace of a Fock space to an erasure subspace of the Fock space.

Further, embodiments of the present disclosure provides a method of generating of a cluster state for universal quantum computing from the two or more modified qubits using probabilistic entangling gates. The probabilistic entangling gates may be coupled according to a predefined graph structure (e.g., having a percolation threshold greater than the success probability for generating respective nodes of the predefined graph structure using the probabilistic entangling gates). Stated another way, the methods and devices described herein generate cluster states for universal quantum computing directly from the modified qubits.

Thus, methods and devices are provided herein for generation of cluster states from Bell pairs (e.g., use only Bell pairs as resources for generating cluster states). Generating cluster states from Bell pairs is advantageous because Bell pairs may be generated with significantly fewer resources than larger entangled states (e.g., GHZ states).

Finally, in some embodiments a quantum computational algorithm may be performed using the quantum cluster state generated from the two or more modified qubits.

The techniques described herein may be implemented in and/or used with a number of different types of devices, including but not limited to photonic quantum computing devices and/or systems, hybrid quantum/classical computing systems, and any of various other quantum computing systems.

This Summary is intended to provide a brief overview of some of the subject matter described in this document. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

For a better understanding of the various described embodiments, reference should be made to the Detailed Description below, in conjunction with the following drawings in which like reference numerals refer to corresponding parts throughout the Figures.

FIGS. 15A-K illustrate additional circuit diagrams and corresponding matrices for constructing various types of quantum states, according to some embodiments.

Figure 1:
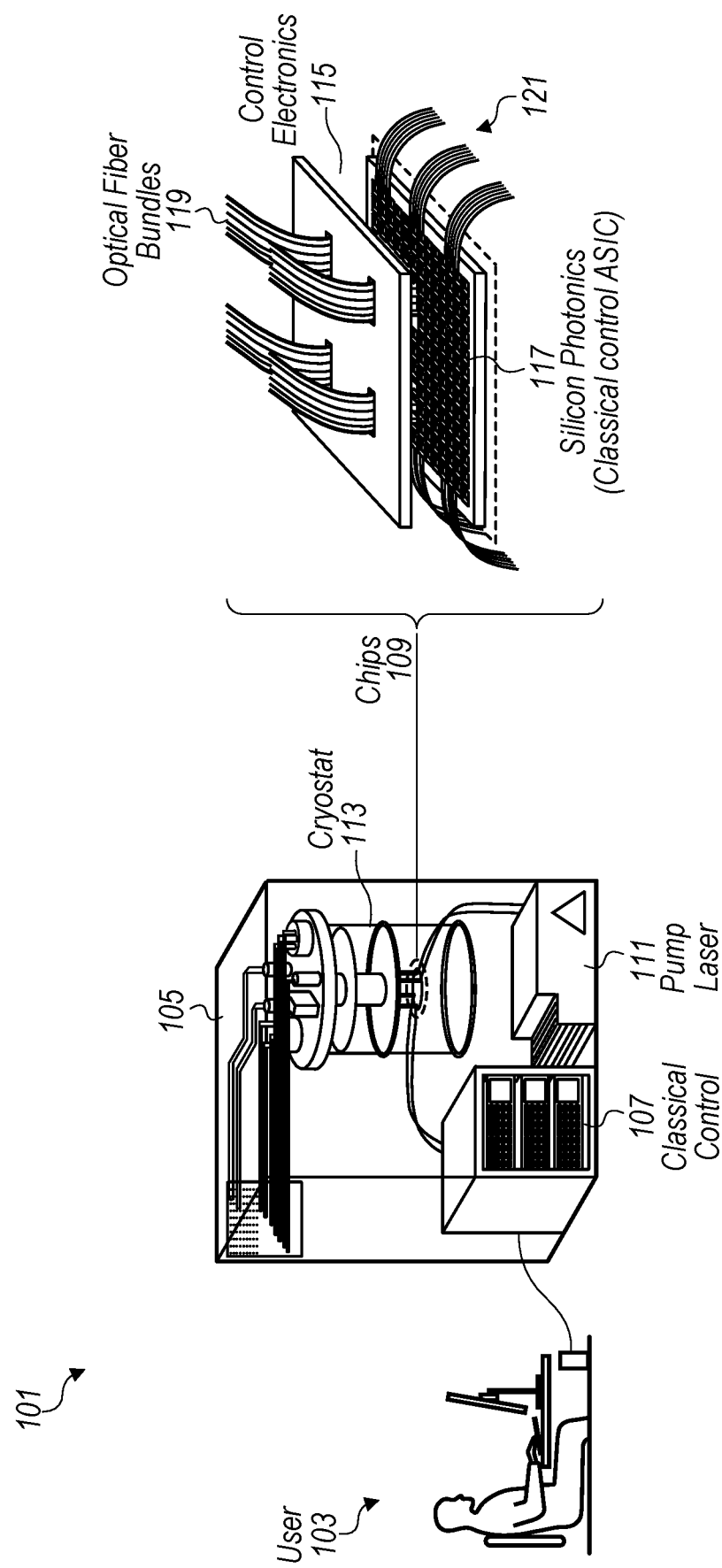
FIG. 1 shows a hybrid computing system in accordance with one or more embodiments.

While the features described herein may be susceptible to various modifications and alternative forms, specific embodiments thereof are shown by way of example in the drawings and are herein described in detail. It should be understood, however, that the drawings and detailed description thereto are not intended to be limiting to the particular form disclosed, but on the contrary, the intention is to cover all modifications, equivalents and alternatives falling within the spirit and scope of the subject matter as defined by the appended claims.

DETAILED DESCRIPTION

Reference will now be made in detail to embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

I. Introduction to Qubits and Path Encoding

The dynamics of quantum objects, e.g., photons, electrons, atoms, ions, molecules, nanostructures, and the like, follow the rules of quantum theory. More specifically, in quantum theory, the quantum state of a quantum object, e.g., a photon, is described by a set of physical properties, the complete set of which is referred to as a mode. In some embodiments, a mode is defined by specifying the value (or distribution of values) of one or more properties of the quantum object. For example, again for photons, modes can be defined by the frequency of the photon, the position in space of the photon (e.g., which waveguide or superposition of waveguides the photon is propagating within), the associated direction of propagation (e.g., the k-vector for a photon in free space), the polarization state of the photon (e.g., the direction (horizontal or vertical) of the photon's electric and/or magnetic fields) and the like.

For the case of photons propagating in a waveguide, it is convenient to express the state of the photon as one of a set of discrete spatio-temporal modes. For example, the spatial mode $k_i$ of the photon may be determined according to which one of a finite set of discrete waveguides the photon may be propagating in. Furthermore, the temporal mode $t_j$ may be determined by which one of a set of discrete time periods (referred to herein as "bins") the photon may be present in. In some embodiments, the temporal discretization of the system may be provided by the timing of a pulsed laser, which may be responsible for generating the photons. In the examples below, spatial modes may be used primarily to avoid complication of the description. However, one of ordinary skill will appreciate that the systems and methods may apply to any type of mode, e.g., temporal modes, polarization modes, and any other mode or set of modes that serves to specify the quantum state. Furthermore, in the description that follows, embodiments will be described that employ photonic waveguides to define the spatial modes of the photon. However, one of ordinary skill having the benefit of this disclosure will appreciate that any type of mode, e.g., polarization modes, temporal modes, and the like, may be used without departing from the scope of the present disclosure.

For quantum systems of multiple indistinguishable particles, rather than describing the quantum state of each particle in the system, it is useful to describe the quantum state of the entire many-body system using the formalism of Fock states (sometimes referred to as the occupation number representation). In the Fock state description, the many-body quantum state may be specified by how many particles there are in each mode of the system. Because modes describe the complete set of quantum properties, this description may sufficiently describe the quantum state of the system. For example, a multi-mode, two particle Fock state $|1001\rangle_{1,2,3,4}$ may specify a two-particle quantum state with one photon in mode 1, zero photons in mode 2, zero photons in mode three, and 1 photon in mode four. Again, as introduced above, a mode may be any set of properties of the quantum object (and may depend on the single particle basis states being used to define the quantum state). For the case of the photon, any two modes of the electromagnetic field may be used, e.g., one may design the system to use modes that are related to a degree of freedom that may be manipulated passively with linear optics. For example, polarization, spatial degree of freedom, or angular momentum, may be used. For example, the four-mode system represented by the two particle Fock state $|1001\rangle_{1,2,3,4}$ may be physically implemented as four distinct waveguides with two of the four waveguides (representing mode 1 and mode 4, respectively) having one photon travelling within them. Other examples of a state of such a many-body quantum system are the four photon Fock state $|1111\rangle_{1,2,3,4}$ that represents each waveguide containing one photon and the four photon Fock state $|2200\rangle_{1,2,3,4}$ that represents waveguides one and two respectively housing two photons and waveguides three and four housing zero photons. For modes having zero photons present, the term "vacuum mode" is used. For example, for the four photon Fock state $|2200\rangle_{1,2,3,4}$ modes 3 and 4 are referred to herein as "vacuum modes."

As used herein, a "qubit" (or quantum bit) is a physical quantum system with an associated quantum state that may be used to encode information. Qubits, in contrast to classical bits, may have a state that is a superposition of logical values such as 0 and 1. In some embodiments, a qubit is "dual-rail encoded" such that the logical value of the qubit is encoded by occupation of one of two modes by exactly one photon (a single photon). For example, consider the two spatial modes of a photonic system associated with two distinct waveguides. In some embodiments, the logical 0 and 1 values may be encoded as follows:

$$|0\rangle_L = |10\rangle_{1,2}$$

$$|1\rangle_L = |01\rangle_{1,2}$$

where the subscript "L" indicates that the ket vector represents a logical value (e.g., a qubit value) and, as before, the notation $|ij\rangle_{1,2}$ on the right-hand side of the equations above indicates that there are i photons in a first waveguide and j photons in a second waveguide, respectively (e.g., where i and j are integers). In this notation, a two qubit state having a logical value $|01\rangle_L$ (representing a state of two qubits, the first qubit being in a '0' logical state and the second qubit being in a '1' logical state) may be represented using photon occupations across four distinct waveguides by $|1001\rangle_{1,2,3,4}$ (i.e., one photon in a first waveguide, zero photons in a second waveguide, zero photons in a third waveguide, and one photon in a fourth waveguide). In some instances, throughout this disclosure, the various subscripts are omitted to avoid unnecessary mathematical clutter.

A Bell pair is a pair of qubits in any type of maximally entangled state referred to as a Bell state. For dual rail encoded qubits, examples of Bell states include:

$$|\Phi^+\rangle = \frac{|0\rangle_L |0\rangle_L + |1\rangle_L |1\rangle_L}{\sqrt{2}} = \frac{|1010\rangle + |0101\rangle}{\sqrt{2}} \quad (1)$$

$$|\Phi^-\rangle = \frac{|0\rangle_L |0\rangle_L - |1\rangle_L |1\rangle_L}{\sqrt{2}} = \frac{|1010\rangle - |0101\rangle}{\sqrt{2}} \quad (2)$$

$$|\Psi^+\rangle = \frac{|0\rangle_L |1\rangle_L + |1\rangle_L |0\rangle_L}{\sqrt{2}} = \frac{|1001\rangle + |0110\rangle}{\sqrt{2}} \quad (3)$$

$$|\Psi^-\rangle = \frac{|0\rangle_L |1\rangle_L - |1\rangle_L |0\rangle_L}{\sqrt{2}} = \frac{|1001\rangle - |0110\rangle}{\sqrt{2}} \quad (4)$$

An m-qubit Greenberger-Horne-Zeilinger (GHZ) state (or "m-GHZ state") is an entangled quantum state of m qubits. For a given orthonormal logical basis, an m-GHZ state is a quantum superposition of all qubits being in a first basis state superposed with all qubits being in a second basis state:

$$|GHZ\rangle = \frac{|0\rangle^{\otimes M} + |1\rangle^{\otimes M}}{\sqrt{2}} \quad (5)$$

where the kets above refer to the logical basis.

For example, for qubits encoded by single-photons in pairs of modes, a 3-GHZ state may be written:

$$|GHZ\rangle = \frac{|0\rangle_L |0\rangle_L |0\rangle_L - |1\rangle_L |1\rangle_L |1\rangle_L}{\sqrt{2}} = \frac{|101010\rangle + |010101\rangle}{\sqrt{2}} \quad (6)$$

where the kets above refer to photon occupation number in six respective modes (with mode subscripts omitted for simplicity).

Some embodiments of the present disclosure provide a method of generating an m-photon entangled state in a multi-mode quantum system such as an integrated photonic system employing waveguides, beam splitters, photonic switches, and single photon detectors. Some embodiments described herein employ photonic waveguides to define the modes that may be occupied by one or more photons, with the different waveguides defining the different spatial modes available for the photons to occupy. In addition, in this example, the mode couplers may be optical beam splitters. However, one of ordinary skill having the benefit of this disclosure will appreciate that modes defined by any set of degrees of freedom, e.g., polarization modes, temporal modes, and the like, can be used without departing from the scope of the present disclosure. For modes that only differ in polarization (e.g., horizontal (H) and vertical (V)), a coupler may be any optical element that coherently rotates polarization, e.g., a birefringent material such as a waveplate. For other systems such as ion trap systems or neutral atom systems, a mode coupler may be any physical mechanism that can couple two modes, e.g., a pulsed electromagnetic field that is tuned to couple two internal states of the atom/ion.

Figure 2:
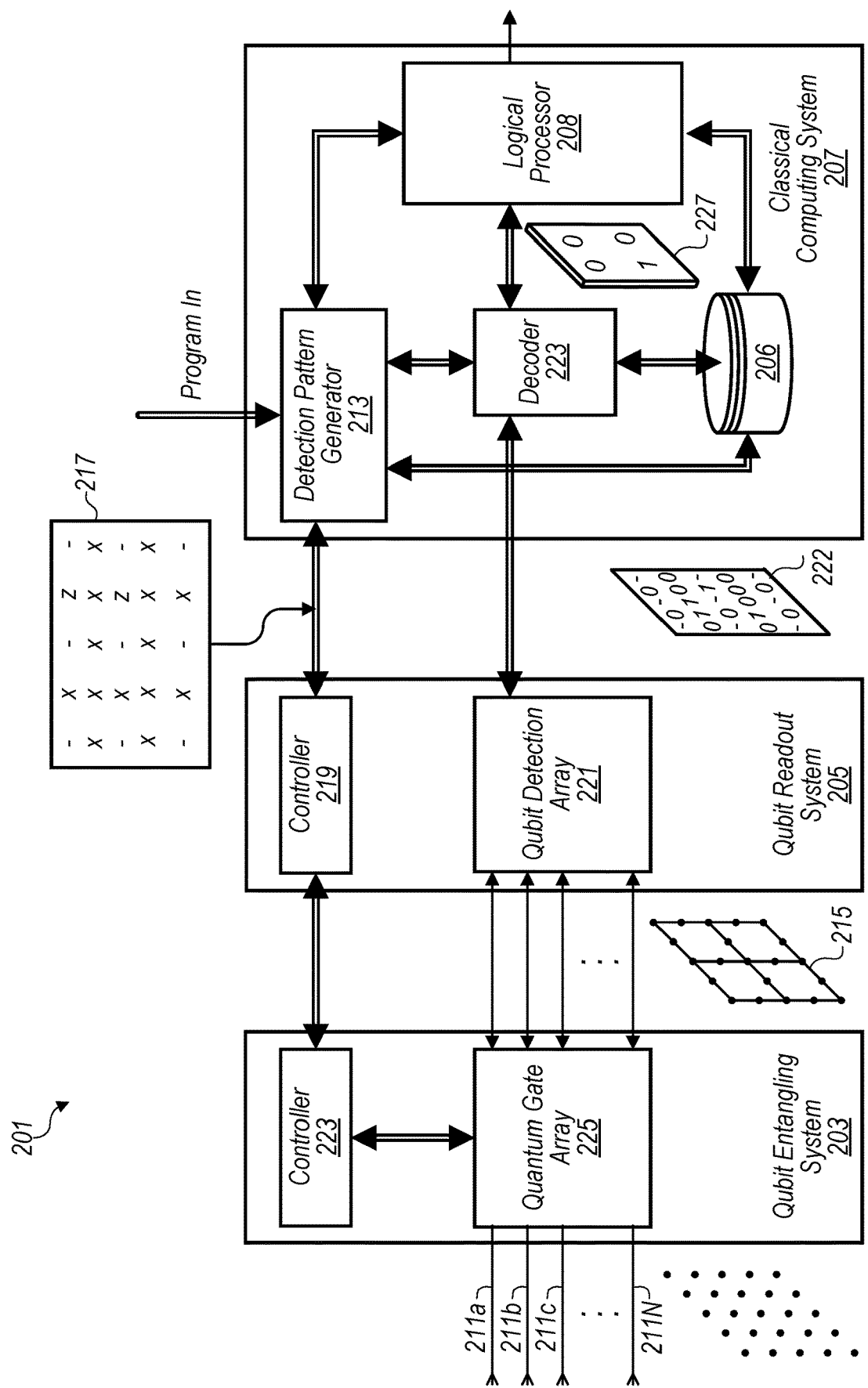
FIG. 2 is a block diagram of a hybrid quantum computing system, in accordance with some embodiments.
Figure 3:
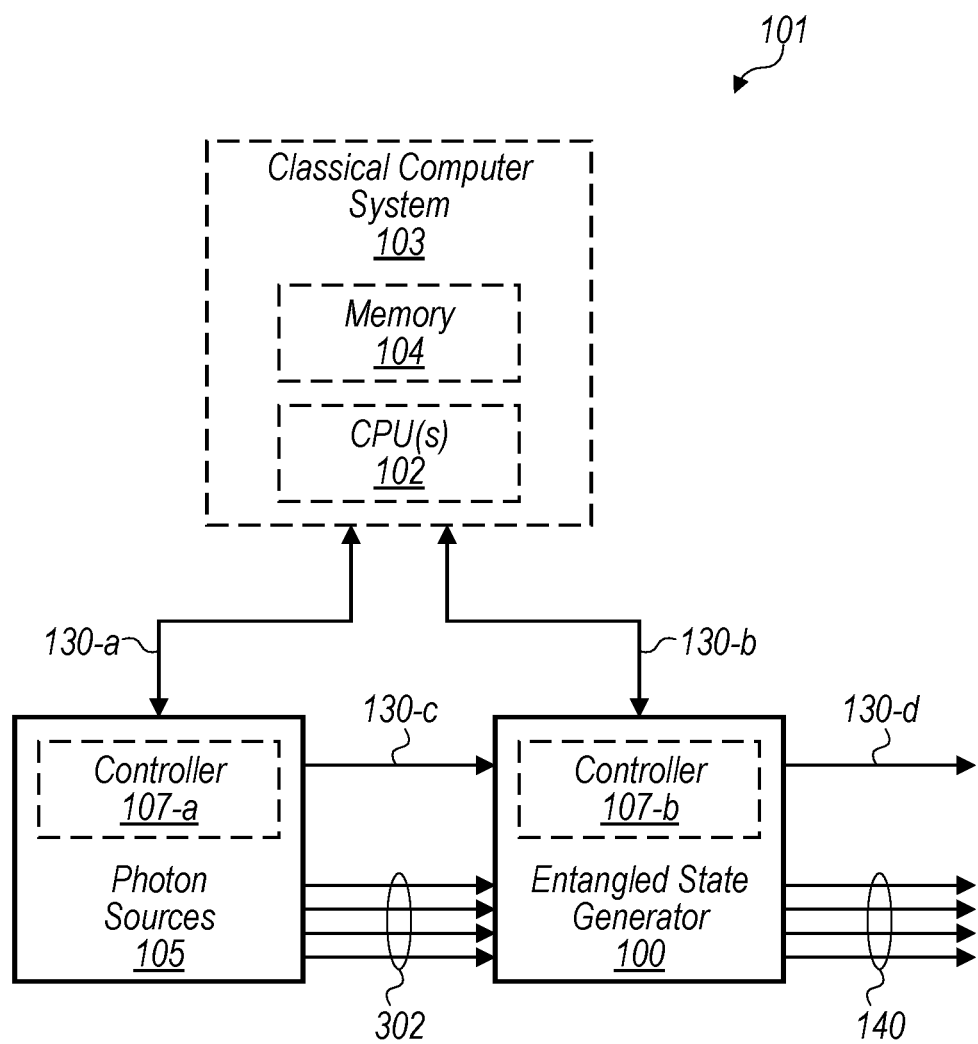
FIG. 3 shows a detailed schematic diagram of a hybrid quantum computing system in accordance with some embodiments.

II. FIGS. 1-3—Hybrid Classical-Quantum Computing System

FIG. 1 shows a hybrid computing system in accordance with one or more embodiments. The hybrid computing system 101 includes a user interface device 103 that is communicatively coupled to a hybrid quantum computing (QC) sub-system 105, described in more detail below in FIGS. 2-3. The user interface device 103 may be any type of user interface device, e.g., a terminal including a display, keyboard, mouse, touchscreen and the like. In addition, the user interface device may itself be a computer such as a personal computer (PC), laptop, tablet computer and the like. In some embodiments, the user interface device 103 provides an interface with which a user may interact with the hybrid QC subsystem 105. For example, the user interface device 103 may run software, such as a text editor, an interactive development environment (IDE), command prompt, graphical user interface, and the like so that the user may program, or otherwise interact with, the QC subsystem to run one or more quantum algorithms. In other embodiments, the QC subsystem 105 may be pre-programmed and the user interface device 103 may simply be an interface where a user may initiate a quantum computation, monitor the progress, and receive results from the hybrid QC subsystem 105. Hybrid QC subsystem 105 may further include a classical computing system 107 coupled to one or more quantum computing chips 109. In some examples, the classical computing system 107 and the quantum computing chip 109 may be coupled to other electronic components 111, e.g., pulsed pump lasers, microwave oscillators, power supplies, networking hardware, etc. In some embodiments that require cryogenic operation, the quantum computing system 109 may be housed within a cryostat, e.g., cryostat 113. In some embodiments, the quantum computing chip 109 may include one or more constituent chips, e.g., hybrid electronic chip 115 and integrated photonics chip 117. Signals may be routed on- and off-chip any number of ways, e.g., via optical interconnects 119 and via other electronic interconnects 121. In addition, the hybrid computing system 101 may employ a quantum computing process, e.g., measurement-based quantum computing (MBQC) that employs one or more cluster states of qubits as described in further detail below.

FIG. 2 shows a block diagram of a hybrid QC system 201 in accordance with some embodiments. Such a system may be associated with the hybrid computing system 101 introduced above in reference to FIG. 1. For example, FIG. 2 illustrates schematically how the components of the classical computing system 107, the quantum computing chip 109, the cryostat 113, and the other electronic components such as the pump laser 111 functionally interact to produce and detect entangled qubits and perform quantum computational algorithms. In FIG. 2, single lines represent quantum information channels and double lines represent classical information channels. The QC system 201 includes a qubit entangling system 203, a qubit readout system 205, and a classical computing system 207. In some embodiments, the qubit entangling system 203 takes as input a collection of N physical qubits, e.g., physical qubits 209 (also represented schematically as inputs 211a, 211b, 211c, . . . , 211N) and generates quantum entanglement between two or more of them to generate an entangled state 215. For example, in the case of photonic qubits, the qubit entangling system 203 may be a linear optical system such as an integrated photonic circuit that includes waveguides, beam splitters, photon detectors, delay lines, and the like. In some examples, the entangled state 215 may be a lattice, cluster, or graph state, or one part of a larger lattice, cluster, or graph state that is created over the course of several clock cycles of the quantum computer. In some embodiments, the input qubits 209 may be a collection of quantum systems and/or particles and may be formed using any qubit architecture. For example, the quantum systems may be particles such as atoms, ions, nuclei, and/or photons. In other examples, the quantum systems may be other engineered quantum systems such as flux qubits, phase qubits, or charge qubits (e.g., formed from a superconducting Josephson junction), topological qubits (e.g., *Majorana* fermions), or spin qubits formed from vacancy centers (e.g., nitrogen vacancies in diamond). Furthermore, for the sake of clarity of description, the term "qubit" is used herein although the system may also employ quantum information carriers that encode information in a manner that is not necessarily associated with a binary bit. For example, qudits may be used, i.e., quantum systems that can encode information in more than two quantum states in accordance with some embodiments.

In accordance with some embodiments, the QC system 201 may be a quantum circuit-based quantum computer or a measurement-based quantum computer. In either case, a software program (e.g., a set of machine-readable instructions) that represents the quantum algorithm to be run on the QC system 201 may be passed to a classical computing system 207 (e.g., corresponding to system 107 in FIG. 1 above). The classical computing system 207 may be any type of computing device such as a PC, one or more blade servers, and the like, or even a high-performance computing system such as a supercomputer, server farm, and the like. Such a system may include one or more processors (not shown) coupled to one or more computer memories, e.g., memory 206. Such a computing system will be referred to herein as a "classical computer." In some examples, the software program may be received by a classical computing module, referred to herein as a detection pattern generator 213. One function of the detection pattern generator 213 may be to generate a set of machine-level instructions from the input software program (which may originate as code that may be more easily written by a user to program the quantum computer), i.e., the detector pattern generator 213 may operate as a compiler for software programs to be run on the quantum computer. Detection pattern generator module 213 may be implemented as pure hardware, pure software, or any combination of one or more hardware or software components or modules. In some examples, the compiled machine-level instructions may take the form of one or more data frames that instruct the qubit readout circuit to make one or more quantum measurements on the entangled state 215. For example, measurement pattern data frame 217 is one example of the set of measurements that may be applied to the individual qubits of entangled state 215 during a certain clock cycle as the program is executed.

In some embodiments, several measurement patterns 217 may be stored in memory 206 as classical data. Generally, the measurement patterns 217 may dictate whether or not a detector from the qubit detection array 221 of the qubit readout circuit 205 should make a measurement on a given qubit that makes up the entangled state 215. In addition, the measurement pattern 217 may also store which basis (e.g., Pauli bases X, Y, Z, etc.) the measurement is to be made in order to execute the program. In some embodiments, the measurement pattern 213 may also include a set of gates that may be applied by the qubit entangling circuit to the next set of physical qubits 209 that are to be processed at some future clock cycle of the QC system 201.

A controller circuit 219 of the qubit readout circuit 205 may receive data that encodes the measurement pattern 217 and generates the configuration signals necessary to drive a set of detectors within the qubit detection array 221. The detectors may be any type of detector that that can detect the quantum states of one or more of the qubits in the entangled state 215. For example, for the case of photonic qubits, the detectors may be single photon detectors that are coupled to one or more waveguides, beam splitters, interferometers, switches, polarizers, polarization rotators, and the like. One of ordinary skill will appreciate that many types of detectors may be used depending on the particular qubit architecture being used.

In some embodiments, the result of applying the detection pattern 217 to the qubit detection array is a readout operation that "reads out" the quantum states of the qubits in the entangled state 215. Once this measurement is accomplished, the quantum information stored within the entangled state 215 may be converted to classical information that corresponds to a set of eigenvalues that are measured by the detectors, referred to herein as "measurement outcomes." These measurement outcomes may be stored in a measurement outcome data frame, e.g., data frame 222 and passed back to the classical computing system for further processing.

In some embodiments, any of the submodules in the QC system 201, e.g., controller 223, quantum gate array 225, detection array 221, controller 219, detection pattern generator 213, decoder 223, and logical processor 108 may include any number of classical computing components such as processors (CPUs, GPUs, TPUs) memory (any form of RAM, ROM), hard coded logic components (classical logic gates such as AND, OR, XOR, etc.) and/or programmable logic components such as field programmable gate arrays (FPGAs and the like). These modules may also include any number of application specific integrated circuits (ASICs), microcontrollers (MCUs), systems on a chip (SOCs), and other similar microelectronics.

In some embodiments, the entangled state 215 may be any cluster state described herein. As described herein, the logical qubit measurement outcomes 227 may be fault tolerantly recovered, e.g., via decoder 223, from the measurement outcomes 222 of the physical qubits. Logical processor 208 may then process the logical outcomes as part of the running of the program. As shown, the logical processor may feed back information to the detection pattern generator 213 to affect downstream gates and/or measurements to improve the fault tolerance of subsequent computations.

FIG. 3 illustrates another schematic diagram of the system 101 for obtaining photons in an entangled state (e.g., a GHZ state, Bell pair, and the like), in accordance with some embodiments. As illustrated, system 101 includes a photon source module 105 that is optically connected to entangled state generator 100. Both the photon source module 105 and the entangled state generator 100 may be coupled (e.g., electrically coupled via the classical information channel 130$a$-$b$) to a classical computer system 103 such that the classical computer system 103 can communicate and/or control the photon source module 105 and/or the entangled state generator 100. Photon source module 105 may include a collection of single-photon sources that can provide output photons to entangled state generator 100 by way of interconnecting waveguides 302. Entangled state generator 100 may receive the output photons and convert them to one or more entangled photonic states and then output these entangled photonic states into output waveguides 140 to some downstream circuit that may use the entangled states for performing a quantum computational algorithm, for example. For example, the entangled states generated by the entangled state generator 100 may be used as resources for a downstream quantum optical circuit (not shown), e.g., they may be fused together to build a larger cluster state to be used in a measurement-based quantum computing scheme. In some embodiments, the entangled states generated by the entangled state generator 100 may be used in any system that uses entanglement shared by multiple parties, e.g., in quantum key distribution, quantum computing protocols based on teleportation, quantum communication, and the like.

In some embodiments, the photon source module 105 and the entangled state generator 100 may be used in conjunction with the quantum computing system illustrated in FIG. 2. For example, the qubit entangling system 203 illustrated in FIG. 2 may include the photon source module 105 and the entangled state generator 100, and the classical computer system 103 of FIG. 3 may include one or more of the various classical computing components illustrated in FIG. 2 (e.g, the classical computing system 207).

In terms of the Fock state description of quantum states described above, in one example, the photon source module 105 may output one photon per waveguide thereby generating the quantum state denoted by $|1111\rangle_{2,3,4}$. The action of the entangled state generator 100 may be to convert this input state $|1111\rangle_{1,2,3,4}$ to an entangled state such as a Bell state, e.g., a state described by any one of Equations (1)-(4) described above, with some success probability P. The entangled state may be output into output waveguides 140 with a probability P that is high compared to current methods for generating Bell states or GHZ states.

In some embodiments, system 101 may include classical channels 130 (e.g., classical channels 130-$a$ through 130-$d$) for interconnecting and providing classical information between components. It should be noted that classical channels 130-$a$ through 130-$d$ need not all be the same. For example, classical channel 130-$a$ through 130-$c$ may comprise a bi-directional communication bus carrying one or more reference signals, e.g., one or more clock signals, one or more control signals, or any other signal that carries classical information, e.g., heralding signals, photon detector readout signals, and the like.

In some embodiments, system 101 includes the classical computer system 103 that communicates with and/or controls the photon source module 105 and/or the entangled state generator 100. For example, in some embodiments, classical computer system 103 is used to configure one or more circuits, e.g., using system clock that may be provided to photon sources 105 and entangled state generator 100 as well as any downstream quantum photonic circuits used for performing quantum computation (e.g., quantum computation circuits, which may include optical circuits, electrical circuits, or other types of circuits). In some embodiments, classical computer system 103 includes memory 104, one or more processor(s) 102, a power supply, an input/output (I/O) subsystem, and a communication bus or interconnecting these components. The processor(s) 102 may execute modules, programs, and/or instructions stored in memory 104 and thereby perform processing operations.

In some embodiments, memory 104 stores one or more programs (e.g., sets of instructions) and/or data structures. For example, in some embodiments, entangled state generator 100 attempts to produce an entangled state over successive stages, any one of which may be successful in producing an entangled state. In some embodiments, memory 104 stores one or more programs for determining whether a respective stage was successful and configuring the entangled state generator 100 accordingly (e.g., by configuring entangled state generator 100 to switch the photons to an output if the stage was successful, or pass the photons to the next stage of the entangled state generator 100 if the stage was not yet successful). To that end, in some embodiments, memory 104 stores detection patterns (described below) from which the classical computing system 103 may determine whether a stage was successful. In addition, memory 104 can store settings that are provided to the various configurable components (e.g., switches) described herein that are configured by, e.g., setting one or more phase shifts for the component.

In some embodiments, some or all of the above-described functions may be implemented with hardware circuits on photon source module 105 and/or entangled state generator 100. For example, in some embodiments, photon source module 105 includes one or more controllers 107-$a$ (e.g., logic controllers) (e.g., which may comprise field programmable gate arrays (FPGAs), application specific integrated circuits (ASICS), a "system on a chip" that includes classical processors and memory, or the like). In some embodiments, controller 107-$a$ determines whether photon source module 105 was successful (e.g., for a given attempt on a given clock cycle, described below) and outputs a reference signal indicating whether photon source module 105 was successful. For example, in some embodiments, controller 107-$a$ outputs a logical high value to classical channel 130-$a$ and/or classical channel 130-$c$ when photon source module 105 is successful and outputs a logical low value to classical channel 130-$a$ and/or classical channel 130-$c$ when photon source module 105 is not successful. In some embodiments, the output of control 107-$a$ may be used to configure hardware in controller 107-$b$.

Similarly, in some embodiments, entangled state generator 100 includes one or more controllers 107-$b$ (e.g., logical controllers) (e.g., which may comprise field programmable gate arrays (FPGAs), application specific integrated circuits (ASICS), or the like) that determine whether a respective stage of entangled state generator 100 has succeeded, perform the switching logic described above, and output a reference signal to classical channels 130-$b$ and/or 130-$d$ to inform other components as to whether the entangled state generator 100 has succeeded.

In some embodiments, classical computing system 103 generates a system clock signal and provides the system clock signal to photon source module 105 and entangled state generator 100 via classical channels 130-$a$ and/or 130-$b$. In some embodiments, the system clock signal provided to photon source module 105 triggers photon source module 105 to attempt to output one photon per waveguide thereby attempting to generate the quantum state denoted by $|1111\rangle_{1,2,3,4}$. In some embodiments, the system clock signal provided to entangled state generator 100 triggers, or gates, sets of detectors in entangled state generator 100 to attempt to detect photons. For example, in some embodiments, triggering a set of detectors in entangled state generator 100 to attempt to detect photons includes gating the set of detectors.

It should be noted that, in some embodiments, photon source module 105 and entangled state generator 100 may have internal clocks. For example, photon source module 105 may have an internal clock generated and/or used by controller 107-*a* and entangled state generator 100 has an internal clock generated and/or used by controller 107-*b*. In some embodiments, the internal clock of photon source module 105 and/or entangled state generator 100 is synchronized to an external clock (e.g., the system clock provided by classical computer system 103) (e.g., through a phase-locked loop). In some embodiments, any of the internal clocks may themselves be used as the system clock, e.g., an internal clock of the photon source may be distributed to other components in the system and used as the master/system clock.

In some embodiments, photon source module 105 includes a plurality of probabilistic photon sources that may be spatially and/or temporally multiplexed, i.e., a so-called multiplexed single photon source. In one example of such a source, the source is driven by a pump, e.g., a light pulse, that is coupled into an optical resonator that, through some nonlinear process (e.g., spontaneous four wave mixing, second harmonic generation, and the like) may generate zero, one, or more photons. As used herein, the term "attempt" is used to refer to the act of driving a photon source with some sort of driving signal, e.g., a pump pulse, that may produce output photons non-deterministically (i.e., in response to the driving signal, the probability that the photon source will generate one or more photons may be less than 1). In some embodiments, a respective photon source may be most likely to, on a respective attempt, produce zero photons (e.g., there may be a 90% probability of producing zero photons per attempt to produce a single-photon). The second most likely result for an attempt may be production of a single-photon (e.g., there may be a 9% probability of producing a single-photon per attempt to produce a single-photon). The third most likely result for an attempt may be production of two photons (e.g., there may be an approximately 1% probability of producing two photons per attempt to produce a single photon). In some circumstances, there may be less than a 1% probability of producing more than two photons.

In some embodiments, the apparent efficiency of the photon sources may be increased by using a plurality of single-photon sources (e.g., a redundant number of single-photon sources) and multiplexing the outputs of the plurality of photon sources.

In some embodiments, the photon sources are faint lasers (e.g., a single-photon source 105 may be produced by attenuating a conventional laser beam to reduce its intensity and thereby reduce a mean photon number per pulse to less than one). In some embodiments, photon sources 105 are faint light-emitting diodes (LEDs).

The photon sources of photon source module 105 may output photons (e.g., single photons) to Bell state generator 100 via waveguides 302. Various embodiments of Bell state generator 100 and waveguides 302 are described in greater detail below.

III. Suppressing Error Rates in State Generation Via Pauli-to-Erasure Conversion Embodiments herein describe methods and photonic quantum computing systems whereby Pauli error rates, especially those arising from partial-distinguishability, in state generation schemes may be significantly suppressed. More specifically, methods and systems disclosed herein provide for the conversion of Pauli errors to erasure and heralded loss.

In some embodiments, a dual-rail photonic qubit in a state generation process may experience two types of errors: Pauli errors and erasure errors. Pauli errors are those for which the state remains within the logical qubit subspace, i.e. there is still a single photon across the two waveguides which define the qubit, but some non-identity operation has been applied to the intended, ideal state. Erasure errors are those for which the state has left the logical qubit subspace. In other words, the total number of photons within the two waveguides is no longer equal to one after occurrence of an erasure error. In these cases, the qubit may be considered lost.

Erasure in state generation may be considered to be more benign than Pauli errors, since it is often detectable and may thus be filtered out with a corresponding reduction in success probability of the computation or algorithm. In contrast, Pauli errors may be more difficult to detect, and may compromise the final result of the computation or algorithm. In addition, erasure thresholds for error-correcting codes are generally much higher than logical error thresholds.

For a single qubit, linear optics (LO) leaves Pauli and erasure rates unchanged, since total photon number is left invariant. However, for multiple qubits, when the total number of photons across the qubit waveguides is correct, general LO transformations between these modes may couple terms in the erasure and qubit subspaces, allowing for a trade-off between the corresponding error rates. Embodiments herein propose systems and methods to utilize Pauli-to-erasure error conversion to exploit this trade-off to improve the functionality of a photonic quantum computing architecture.

Figure 4A:
FIGS. 4A-B are key diagrams defining components of circuit diagrams in the Figures, according to some embodiments.
Figure 4A:
Figure 4A:
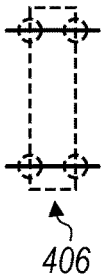
Figure 4A:
Figure 4A:
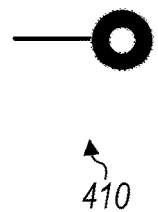
Figure 4B:
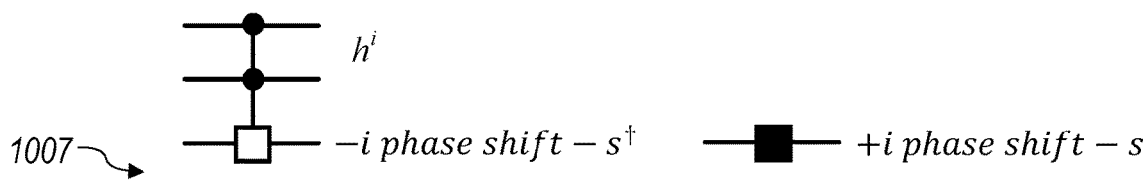
Figure 4B:
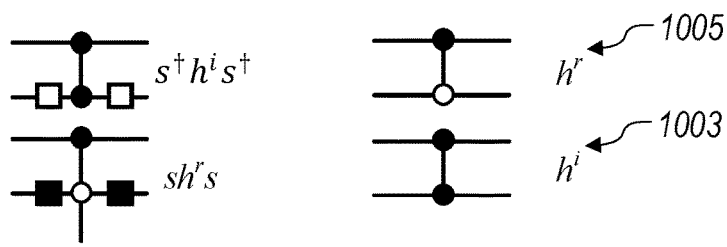
Figure 4B:
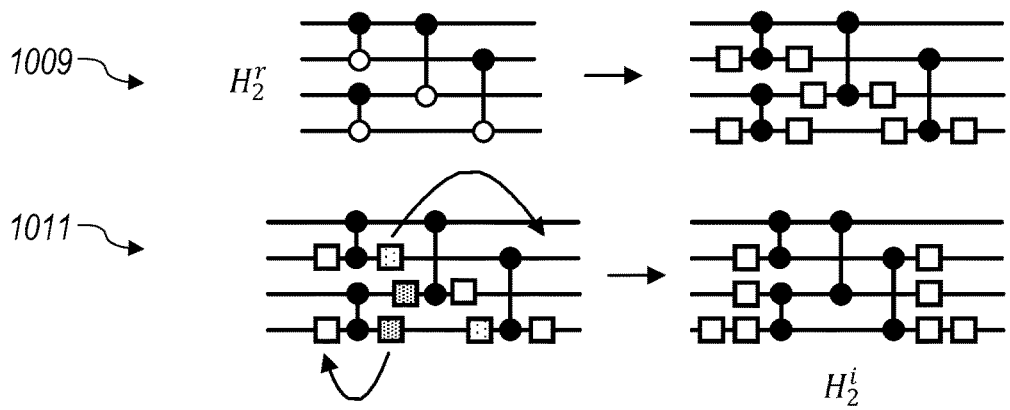

FIGS. 4A-4B—Circuit Diagram Notation

In the schematic circuit diagrams used herein, e.g., FIGS. 5-6 and 8-12, certain components/quantum gates are represented as shown in FIGS. 4A and 4B. For example, FIG. 4A illustrates the schematic elements used herein to depict each of a beamsplitter 402, a π (i.e., 180°) phase shifter 404, a set of modes defining a qubit 406, a modeswap 408, and a classical measurement of a mode 410. Additionally, the horizontal and diagonal lines in the schematic circuit diagrams 412 denote waveguides, or more generally, any type of mode used in the quantum computational system.

FIG. 4B illustrates in further detail the definitions and relations between beamsplitters and n-mode Hadamard gates, which may be translated to the path-encoded diagrams using the illustrated notation. Mathematically, the imaginary Hadamard may be written as $$h^i = \frac{1}{\sqrt{2}}\begin{pmatrix} 1 & i \\ i & 1 \end{pmatrix}$$

and the real Hadamard $h^r$ may be written as $$h^r = \frac{1}{\sqrt{2}}\begin{pmatrix} 1 & 1 \\ 1 & -1 \end{pmatrix}$$

Physically, e.g., in a photonic system, the above Hadamard gates may be implemented as beamsplitters and/or directional couplers. The real and complex Hadamards may be transformed into one another by applying a ±i phase shift to the second mode. The unitary operators that define such a phase shift are given by $$s = \begin{pmatrix} 1 & 0 \\ 0 & i \end{pmatrix} \text{ and } s^\dagger = \begin{pmatrix} 1 & 0 \\ 0 & -i \end{pmatrix},$$

in which case $h^i = sh^r s$ and $h^r = s^\dagger h^i s^\dagger$.

In view of the above mathematical relations, the complex Hadamard corresponds to a real Hadamard preceded and followed by a phase of i on the second mode, and the real Hadamard corresponds to a complex Hadamard preceded and followed by a phase of −i on the second mode. Both matrices are symmetric, but they differ in that $h^i$ applies the same operation to both the modes it acts on, while $h^r$ acts differently on the two modes. This means that, while the order of the input modes may be irrelevant when the complex Hadamard is used, it is important if the real version is applied.

The two-mode imaginary Hadamard $h^i$ and the two-mode real Hadamard $h^r$ can be represented schematically as mode couplers 1003 and 1005, respectively. The transformations between the two are also shown via schematic elements 1007, where −i phase shifts applied to a mode are represented by open boxes and i phase shifts applied to a mode are represented by boxes with black fill. As already described above, these mode couplers can be physically implemented as beamsplitters, directional couplers and the like.

The above description for two-mode Hadamard gates can be generalized to n-mode situations. More specifically an n-mode (also referred to herein as an n-th order Hadamard) real/imaginary Hadamard can be expressed as $$H_n^r = h^r \otimes h^r \otimes \ldots \otimes h^r = h^{r \otimes n}$$

$$H_n^i = h^i \otimes h^i \otimes \ldots \otimes h^i = h^{i \otimes n}$$

For example, the $2^{nd}$ order Hadamards are $$H_2^r = \frac{1}{2}\begin{pmatrix} 1 & 1 & 1 & 1 \\ 1 & -1 & 1 & -1 \\ 1 & 1 & -1 & -1 \\ 1 & -1 & -1 & 1 \end{pmatrix}$$

$$H_2^i = \frac{1}{2}\begin{pmatrix} 1 & i & i & -1 \\ i & 1 & -1 & i \\ i & -1 & 1 & i \\ -1 & i & i & 1 \end{pmatrix}$$

More generally, the 2n×2n Hadamards (real or complex) can be decomposed into products of single beamsplitters using the following formula:

$$H_n^{r(i)} = \prod_{j=1}^{\log_2(N)} \left( \prod_{i=0 \bmod 2^j < 2^{j-1}}^{N-1} h_{i,i+2^{j-1}}^{r(i)} \right)$$

Where $N=2^n$ and the lower indices on $h^{r(i)}$ indicate the modes the beamsplitters act on. For example, expanding this formula gives:

$$H_1^{r(i)} = h_{0,1}^{r(i)}(2 \times 2)$$

$$H_2^{r(i)} = h_{0,1}^{r(i)} h_{2,3}^{r(i)} h_{0,2}^{r(i)} h_{1,3}^{r(i)}(4 \times 4)$$

$$H_3^{r(i)} = h_{0,1}^{r(i)} h_{2,3}^{r(i)} h_{4,5}^{r(i)} h_{6,7}^{r(i)} h_{0,2}^{r(i)} h_{1,3}^{r(i)} h_{4,6}^{r(i)} h_{5,7}^{r(i)} h_{0,4}^{r(i)} h_{1,5}^{r(i)} h_{2,6}^{r(i)} h_{3,7}^{r(i)}(8 \times 8)$$

Schematic diagrams 1009 show one example of the real second order Hadamard. Likewise, schematic 1011 shows the imaginary second order Hadamard. Also included are the steps by which the real Hadamard may be converted to the imaginary Hadamard.

Pauli-Erasure Converters

Figure 5:
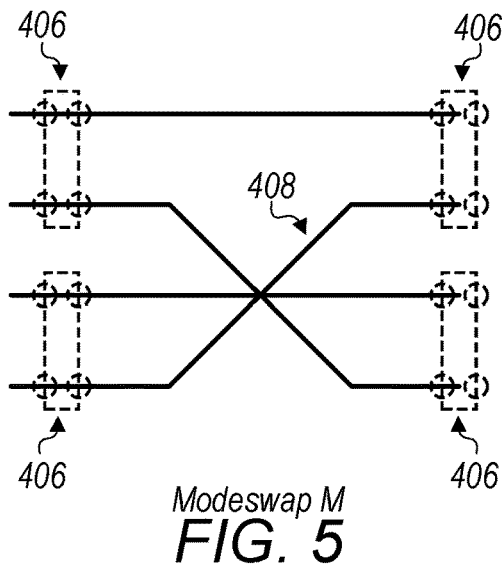
FIG. 5 is a schematic circuit diagram illustrating a mode swap, according to some embodiments.
Figure 6A:
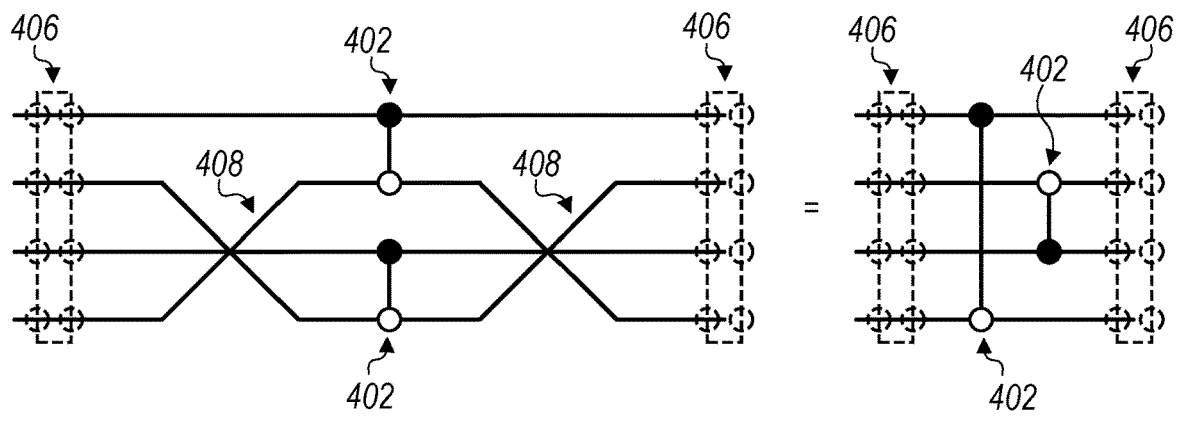
FIGS. 6A-6B are schematic circuit diagrams illustrating Pauli-to-erasure conversion operation, according to some embodiments.
Figure 6B:
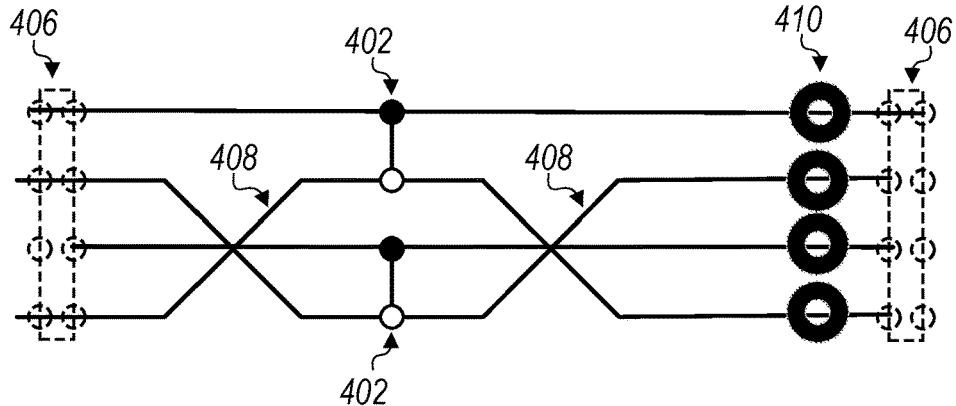

In some embodiments, Pauli-erasure conversion is performed on a two qubit system, where a general photonic state (e.g., using single-mode waveguides such as those illustrated in FIGS. 5 and 6A-B) containing two photons may exist in the ten-dimensional Fock space:

$$\mathcal{H}_F = \mathrm{span}\{|1010\rangle, |1001\rangle, |0110\rangle, |0101\rangle, |1100\rangle, |0011\rangle, |2000\rangle, |0200\rangle, |0020\rangle, |0002\rangle, \}$$

For example, to relate the states of the ten-dimensional Fock space to the schematic circuit diagrams illustrated in FIGS. 5 and 6A-B, a state $|abcd\rangle$, may denote a photonic state where a photons are present in the topmost waveguide 412, b photons are present in the second topmost waveguide, c photons are present in the third waveguide, and d photons are present in the fourth waveguide. FIG. 5 schematically illustrates a dual rail photonic qubit experiencing a general linear optical operation 414. FIGS. 5 and 6A-6B illustrate specific examples of linear optical operations, as explained in further detail below.

Additionally, FIG. 5 illustrates a classical measurement 410 of the four illustrated modes. While FIG. 5 illustrates all four modes being measured, a subset of the modes may also be measured, as desired. Additionally, in some embodiments the classical measurement 410 may be performed such that it may distinguish whether each measured mode is within the logical subspace or the erasure subspace, without measuring the specific state occupied by the measured mode in either the logical subspace or the erasure subspace. Accordingly, the classical measurement may not fully disentangle the quantum entanglement between the four modes, thus preserving the quantum information of the qubit(s). As described in greater detail below, the classical measurement may be used to obtain classical information related to whether one or more photons have been lost or gained in any of the waveguides. For example, the presence of a mode in the erasure subspace may indicate a photon loss.

To build a resource state for linear optical quantum computing (LOQC), it may be desirable to generate a Bell pair, for instance $|\phi^+\rangle = (|1010\rangle - |0101\rangle)/\sqrt{2}$. Accordingly, it may be convenient to describe the logical subspace in the Bell basis:

$$\mathcal{H}_L = \mathrm{span}\{|\phi^+\rangle, |\phi^-\rangle, |\psi^+\rangle, |\psi^-\rangle, \} \quad (1)$$

as they correspond to the ideal state (i.e., the state if no error has occurred), or a local Pauli error applied to the ideal state. The erasure subspace may then be defined as:

$$\mathcal{H}_E = \mathrm{span}\{|1100\rangle, |0011\rangle, |2000\rangle, |0200\rangle, |0020\rangle, |0002\rangle, \} \quad (2)$$

In some embodiments, a circuit of linear-optical operations may be employed which provides a Pauli-erasure conversion consisting of just a mode swap between qubits. For example, exchanging the two modes corresponding to logical $|1\rangle$, (or, alternatively, $|0\rangle$, ) may be described by the transfer matrix M:

$$M = \begin{pmatrix} 1 & 0 & 0 & 0 \\ 0 & 0 & 0 & 1 \\ 0 & 0 & 1 & 0 \\ 0 & 1 & 0 & 0 \end{pmatrix} \quad (3)$$

and may perform the following transformations upon the logical basis states:

$$\mathcal{U}(M)|\phi^+\rangle = |\phi^+\rangle$$

$$\mathcal{U}(M)|\phi^-\rangle = |\phi^-\rangle$$

$$\mathcal{U}(M)|\psi^+\rangle = \frac{1}{\sqrt{2}}(|1100\rangle + |0011\rangle)$$

$$\mathcal{U}(M)|\psi^-\rangle = \frac{1}{\sqrt{2}}(|1100\rangle - |0011\rangle)$$

where $\mathcal{U}(M)$ is the unitary operator on $\mathcal{H}_F$ corresponding to the transfer matrix M. A schematic circuit diagram illustrating the mode swap operator $\mathcal{U}(M)$ 408 is shown in FIG. 5. As illustrated, the horizontal lines in FIG. 5 represents modes 412 such as waveguides, or other optical modes that may each be occupied by one or more photons, and each set of two modes contained within a dashed box 406 represents a dual-mode qubit. Within the logical subspace, $\mathcal{U}(M)$ performs an effective projection onto the space stabilized by ZZ, converting the remainder of the logical state into the erasure subspace. Similarly, swapping modes corresponding to opposite logical states may correspond to an effective projection onto the space stabilized by –ZZ.

For the special case of 2-qubit Bell states, it is possible to convert all Pauli errors to erasure errors. This is because local Hadamards on both qubits (applied via beam splitters 402 on each pair of qubit modes 412, transfer matrix H⊕H) leave two of the Bell states invariant and exchange the other two:

$$\mathcal{U}(H \oplus H)|\phi^+\rangle, = H \otimes H|\phi^+\rangle, = |\phi^+\rangle,$$

$$H \otimes H|\phi^-\rangle, = |\psi^+\rangle,$$

$$H \otimes H|\psi^-\rangle, = |\psi^-\rangle,$$

$$H \otimes H|\phi^+\rangle, = |\phi^-\rangle,$$

Using two beam splitters 402 sandwiched by mode swaps, T=M(H⊕H)M, then performs the transformation $$\mathcal{U}(T)|\phi^+\rangle = |\phi^+\rangle \quad (4)$$

$$\mathcal{U}(T)|\phi^-\rangle = \frac{1}{\sqrt{2}}(|1100\rangle + |0011\rangle)$$

$$\mathcal{U}(T)|\psi^+\rangle = \frac{1}{2}(|2000\rangle - |0200\rangle + |0020\rangle - |0002\rangle)$$

$$\mathcal{U}(T)|\psi^-\rangle = \frac{1}{2}(|2000\rangle + |0200\rangle - |0020\rangle - |0002\rangle).$$

The Pauli-to-erasure conversion matrix T is illustrated as a schematic circuit diagram in FIG. 6A. Accordingly, if the initial state was entirely contained within the logical subspace, this circuit converts all Pauli errors to erasure errors. Of course, realistic sources of error may generally result in the generation of noisy states which contain both Pauli and erasure errors. It may then be the case that performing this conversion increases Pauli error rates as parts of the state initially in the erasure space are brought back to the logical space. In addition, if the state contains distinguishable particles, then imperfect quantum interference may affect its operation. Advantageously, for many currently considered state generation schemes, performing these conversions according to embodiments described herein still results in a suppression of the Pauli error rates.

FIG. 6B is a similar circuit diagram to FIG. 6A that additionally includes a classical measurement 410 of the four illustrated modes. While FIG. 6B illustrates all four modes being measured, a subset of the modes may also be measured, as desired, as described above in reference to FIG. 5.

Figure 7A:
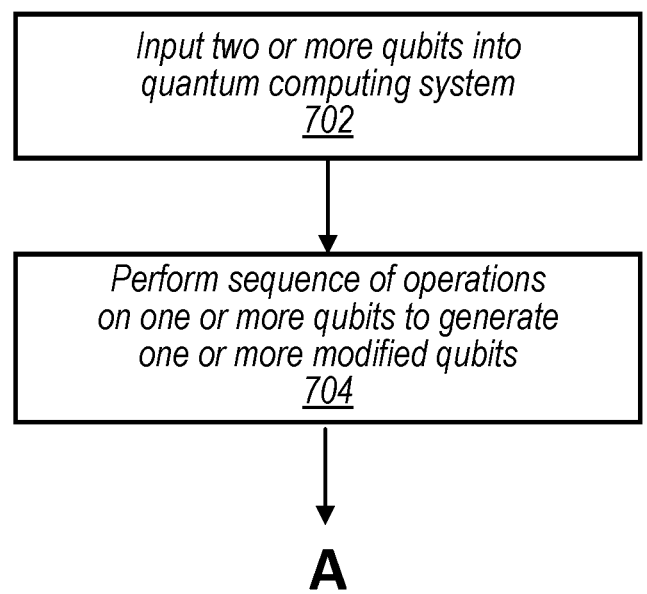
FIG. 7A is a flow chart diagram illustrating a method for performing Pauli-to-erasure conversion, according to some embodiments.

FIG. 7A— Flowchart for Performing Pauli-to-Erasure Conversion

FIG. 7A is a flowchart diagram illustrating a method for performing Pauli-to-erasure error conversion. The method shown in FIG. 7A may be used in conjunction with any of the computer systems or devices shown in the above Figures, among other devices. For example, the method shown in FIG. 7A may be used by a photonic quantum computing device or system 101 and/or 201 as illustrated in FIGS. 1-3, and may include one or more sets of waveguides, one or more sets of beam splitters 402 that couple the respective waveguides to produce a photonic state comprising a plurality of photonic qubits 406 within the one or more sets of waveguides 412. The quantum computing system may further include a controller (e.g., one or more of controllers 107a-b, 21, and/or 223) configured to direct the described method steps, and may be include (or be coupled to) a classical computing system 207 for processing classic information and directing operations of the quantum computing device. In other embodiments, the quantum computing system may utilize a general type of mode structure 412, rather than optical waveguides, and may further utilize more general forms of mode coupling 402 (i.e., rather than beam splitters). It is to be understood this method may be used by any of a variety of types of photonic quantum computing architectures, and these other types of systems should be considered within the scope of the embodiments described herein. In various embodiments, some of the elements of the scheme shown may be performed concurrently, in a different order than shown, or may be omitted. Additional and/or alternative elements may also be performed as desired. As shown, the method of FIG. 7A may operate as follows.

At 702, two or more qubits may be received by a quantum computing system, such as the systems 101 and 201 illustrated in FIGS. 1-3. The two or more qubits may have been generated in an entangled state by a qubit entangling system 203, in some embodiments. In some embodiments, at least one first qubit of the two or more qubits has experienced a Pauli error. For example, during preparation of the two or more qubits, one or more first qubits may have experienced an error (e.g., from environmental noise, decoherence, dephasing, etc.) that altered the state of the first qubit from the original intended state to a second state. When the original intended state and the second state are both within the logical subspace, the error may be considered to be a Pauli error. In contrast, when the original intended state within the logical subspace is inadvertently converted to a third state that is within the erasure subspace and is thereby not within the logical subspace, the error may be considered an erasure error. For example, in reference to the schematic circuit diagram illustrated in FIG. 5, an erasure error may occur when, as a result of environmental noise or other sources of decoherence, a photon is inadvertently added or subtracted from one or more of the waveguides 412.

The two or more qubits may be dual-rail photonic qubits 406, or other types of photonic qubits, among other possibilities. The two or more qubits may be Bell states and they may be generated by utilizing a boosted Bell state generator (BSG) scheme, as described in greater detail below. For example, the boosted BSG scheme may use additional ancilla photons to reduce the prevalence of error in the generated two or more qubits.

At 704, a sequence of operations may be performed on the two or more qubits by the quantum computing system to generate two or more modified qubits, such as linear optical operations 414. The sequence of operations may transform one or more of the first qubits from a logical subspace of a Fock space to an erasure subspace of the Fock space. For example, the sequence of operations may be selected such that it is configured to transform one or more of the states within the logical subspace that do not coincide with the intended logical state (i.e., the original intended state) to a state within the erasure subspace, thereby converting the Pauli error to an erasure error. As one specific example of using linear optical operations to convert Pauli errors to erasure errors, for a dual-rail photonic qubit system prepared into a Bell state (or a superposition of Bell states), the sequence of operations illustrated in FIG. 6A converts each of the states $|\psi^+\rangle$, $|\psi^-\rangle$, and $|\phi^-\rangle$, into the erasure subspace, while leaving the state $|\phi^+\rangle$, invariant. In this example, $|\phi^+\rangle$, is the intended logical state, while any of the other three Bell states would imply that a logical error has occurred. However, $|\phi^+\rangle$, is identified as the intended logical state for exemplary purposes, as any of the four Bell states, as well as other types of states or superpositions of states, may also be utilized as the intended logical state (with corresponding adjustments to the appropriate linear optical operation that would perform Pauli-to-erasure conversion), according to various embodiments.

Advantageously, erasure errors may be tolerated at a higher threshold than Pauli errors without damaging the functionality and/or scalability of the quantum computing system than Pauli errors. Furthermore, erasure errors may be easier to detect than Pauli errors, as they may involve a change in the absolute number of photons in a particular photonic state, for example.

In some embodiments, the sequence of operations 414 leaves invariant one or more second qubits of the two or more qubits that have not experienced a Pauli error, wherein the one or more second qubits are comprised within the logical subspace of the Fock space. For example, if a particular qubit has not experienced a Pauli error and remains within the originally intended logical state, the sequence of operations may be selected such that this particular qubit is unaffected by the sequence of operations.

The sequence of operations 414 may be a sequence of linear optical circuitry operations. For example, the sequence of operations may involve a particular sequence of mode swaps 408 and/or mode couplers 402. As illustrated in FIG. 5, a mode swap may physically switch the photonic occupation of two or more waveguides, as one example. Alternatively, the mode swap may be accomplished implicitly, without physically altering the photonic occupation of the waveguides, by switching the labelling of two respective waveguides (e.g., a modeswap may be implicitly accomplished by redefining "waveguide 1" as waveguide 2, and likewise redefining "waveguide 2" as waveguide 1". In some embodiments, the mode couplers may be photonic beam splitters as illustrated in FIGS. 4 and 6, for example, which may serve to introduce quantum entanglement between two or more photonic qubits. Other examples of photonic mode couplers are also possible, as desired.

Figure 15D:
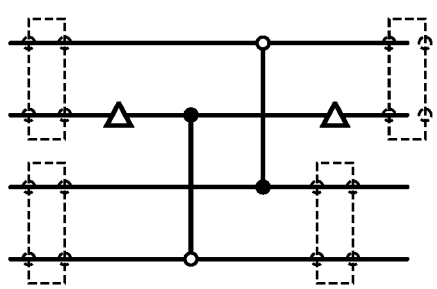
Figure 15E:
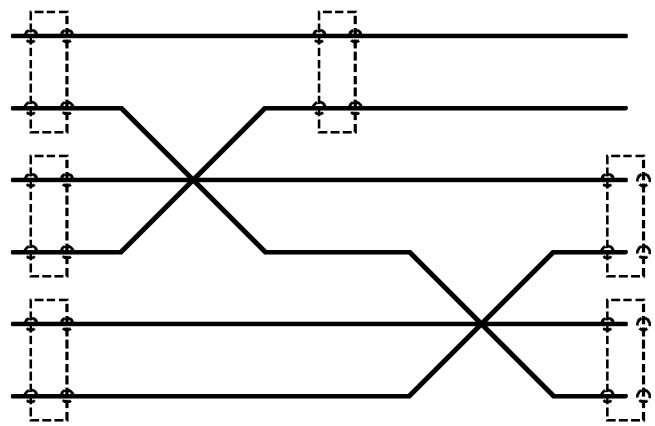
Figure 15E:
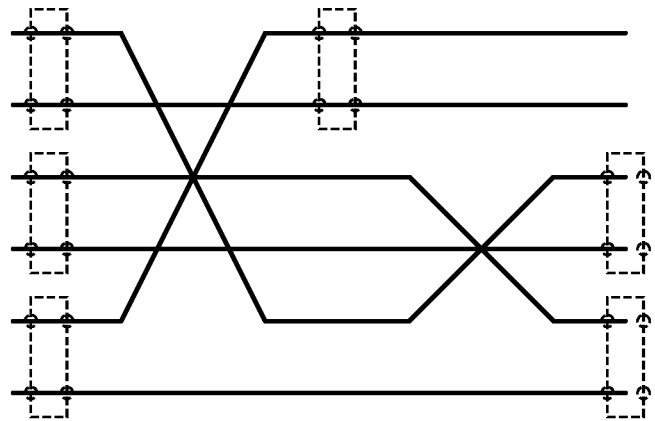

If the two or more qubits consist of exactly two qubits, the sequence of operations may be an ordered sequence of a first mode swap, a beam splitter, and a second mode swap, as illustrated in FIGS. 6A-6B. For a two-qubit system, all of the logical states except for one logical state (e.g., except for the originally intended logical state) may be converted to states within the erasure subspace. If the two or more qubits consist of exactly three qubits, the sequence of operations may consist of an ordered sequence of mode swaps only, two examples of which are illustrated in FIG. 15E, as described in greater detail below. For example, as described above, for a three-qubit system, Pauli-to-erasure error conversion may be accomplished with a sequence of mode swaps 408 without utilizing any beam splitters or mode couplers 402.

The two or more qubits may be comprised within Greenberger-Horne-Zeilinger (GHZ) states, and the two or more qubits may further include a second qubit that has experienced a single Z error. The second qubit may be unaffected by the sequence of operations. For example, for GHZ states with more than two qubits, a second qubit that has experienced a single Z error may be unaffected by the sequence of operations, in addition to the intended (i.e., correct) qubit that is likewise unaffected.

In some embodiments, classical information may be extracted from the two or more modified qubits before generating the quantum cluster state, and the classical information may identify one or more of the two or more modified qubits that are within the erasure subspace. For example, a classical computing system 107, 207 and/or 103 may be coupled to the quantum computing device 201, and it may conduct measurements 410 (e.g., according to a specific measurement pattern 213 as illustrated in FIG. 2) on one or more of the modified qubits to obtain classical information (e.g., the classical data frame 222 and/or decoded logical qubit measurement outcomes 227 of FIG. 2) which determines whether the measured qubits are within the erasure subspace. For example, the classical computing system may be coupled to one or more of the controller circuit 219 and the qubit detection array 221 of the qubit readout circuit 205 to direct the measurement(s) and/or obtain the measurement results. Based on the measurement results, the classical computing system may determine whether the one or more of the two or more modified qubits have received an unintended photon loss (or a photon gain), and the classical information may identify one or more qubits that are within the erasure subspace and that correspond to the lost or gained photon(s), for example.

In some embodiments, the identified one or more modified qubits that are within the erasure subspace may be identified as error qubits for subsequent processing steps in the quantum computational system. For example, the qubits identified within the erasure subspace may be identified as lost in a subsequent generation of a quantum cluster state, or they may be discarded prior to generating the quantum cluster state. For example, if the classical information indicates that a photon loss or gain has occurred in the one or more modified qubits, the one or more modified qubits may be ineffective for conducting a quantum algorithm, and may be discarded (e.g., and potentially subsequently regenerated). Alternatively, in some embodiments it may be determined whether the identified one or more modified qubits comprised within the erasure subspace cause the two or more modified qubits to exceed an erasure error threshold. For example, the erasure error threshold may identify a threshold level of error in the two or more modified qubits, and scalable quantum computation may be attainable as long as the error threshold is not exceeded. Therefore, the measured one or more qubits may only be discarded if the measured level of error is sufficiently high to compromise the computational fidelity of the two or more modified qubits.

If it is determined that the identified one or more modified qubits cause the two or more modified qubits to exceed the erasure error threshold, the identified one or more modified qubits in the erasure subspace may be discarded prior to generating the quantum cluster state. Otherwise, if the identified one or more modified qubits do not cause the two or more modified qubits to exceed the erasure error threshold, the identified one or more modified qubits in the erasure subspace may be included while generating the quantum cluster state. Advantageously, erasure errors may have a higher error threshold than Pauli errors, such that converting Pauli errors to erasure errors in the quantum state may increase the likelihood that the error threshold is not exceeded.

After performing the sequence of operations at step 704, any of a variety of procedures may be implemented on the one or more modified qubits, according to various embodiments. In some embodiments, the method may proceed to generate a quantum cluster state as described in FIG. 7B below. Alternatively, the one or more modified qubits may be utilized directly to perform a quantum computational algorithm. In other embodiments, the one or more modified qubits may be output to a variety of quantum and/or classical computing systems, for further processing, qubit preparation, entanglement, measurement, and/or classical information extraction, among other possibilities, as desired.

Figure 7B:
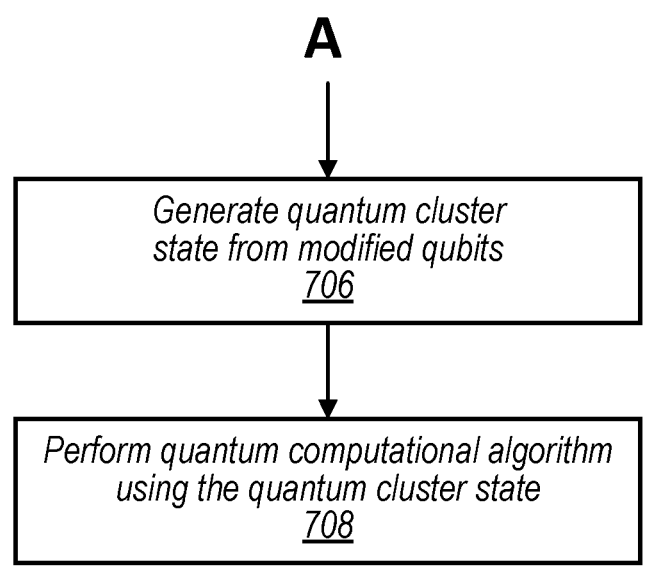
FIG. 7B is a flowchart diagram illustrating a method for generating a quantum cluster state from modified qubits and performing a quantum computational algorithm, according to some embodiments.

FIG. 7B—Quantum Cluster State Generation

FIG. 7B is a flowchart diagram illustrating a method for generating a quantum cluster state, according to some embodiments. The method shown in FIG. 7B may be used in conjunction with any of the computer systems or devices shown in the above Figures, among other devices. FIG. 7B may be implemented following completion of steps 702-704 described above in reference to FIG. 7A. In various embodiments, some of the elements of the scheme shown may be performed concurrently, in a different order than shown, or may be omitted. Additional and/or alternative elements may also be performed as desired. As shown, the method of FIG. 7B may operate as follows.

At 706, a quantum cluster state 215 may be generated based at least in part on the two or more modified qubits produced at step 704 of FIG. 7A. For example, after modifying the qubits, the modified qubits may be input to a quantum cluster state generator such as the entangled state generator 100 or the qubit entangling system 203 for generating the quantum cluster state, as described in greater detail above in reference to FIG. 2.

At 708, a quantum computational algorithm may be performed using the quantum cluster state. For example, any of a variety of quantum computational algorithms may be performed, including Shor's algorithm, Grover's algorithm, quantum simulation algorithms, knot invariant calculations, or hybrid quantum/classical algorithms, among other possibilities, using the quantum cluster state as the input to the quantum algorithm. For example, as described in greater detail above in reference to FIG. 2, a software program representing a quantum algorithm may be passed to the classical computing system 207 to direct a sequence of operations and/or measurements on the quantum cluster state corresponding to the quantum algorithm.

IV. Applications of Pauli-to-Erasure Conversion

The following paragraphs describe additional description and results for improved Bell state generation, ancilla photon utilization, fusion purification, and Greenberger-Horne-Zeilinger (GHZ) state generation, according to various embodiments.

Figure 8:
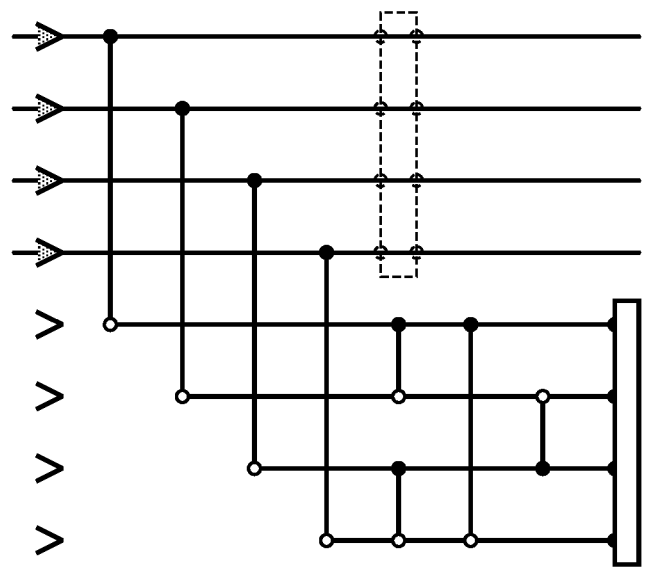
FIG. 8 is a circuit diagram of a standard Bell state generator (BSG), according to some embodiments.

FIG. 8—Bell State Generation

A Bell state generator (BSG) circuit is shown in FIG. 8, according to some existing implementations, which produces a $|\phi^+\rangle$ Bell state (up to conditional mode swaps in some cases) with a probability of success $p_{succ}=3/16$ from four single photons. FIG. 8 is introduced as a reference circuit, to clarify important distinctions of alternative BSG circuits introduced below, according to various embodiments.

Distinguishability Errors

The following paragraphs present quantitative errors estimates corresponding to the logical state produced according to embodiments herein, with and without the conversion circuit T (illustrated in FIG. 6) applied to the qubit modes for different types of physical imperfection.

First, without application of the conversion circuit and using a first-order error model for imperfect sources where, with a probability $1-\epsilon$, a photon is produced in some dominant internal mode (spectral, polarization etc.), $|\Psi_0\rangle$, and with a small probability $\epsilon$ in some orthogonal mode, $|\Psi_\perp\rangle$, the internal state of the input may be expressed as $$\varrho_{int} = (1-\epsilon)^4 |\Psi_0\rangle\langle\Psi_0|^{\otimes 4} + \epsilon(1-\epsilon)^3 \sum_{i=1}^{4} |\Psi_i\rangle\langle\Psi_i| + O(\epsilon^2) \quad (5)$$

where $|\Psi_i\rangle = |\Psi_0\rangle^{\otimes i-1} \otimes |\Psi_\perp\rangle \otimes |\Psi_0\rangle^{\otimes 4-i}$ is the state where the $i^{th}$ photon is distinguishable.

Evolving this input through the circuit and tracing out the internal degrees of freedom (since we may assume that our detectors cannot discriminate between $|\Psi_0\rangle$ and $|\Psi_\perp\rangle$), the resulting state on the qubit modes may be decomposed as:

$$\rho = \frac{1}{\mathcal{N}}\left[\frac{3}{16}(1-4\epsilon)|\phi^+\rangle\langle\phi^+| + 4\epsilon(p_L\sigma_L + p_E\sigma_E) + O(\epsilon^2)\right] \quad (6)$$

Where $p_L$ is the probability of heralding a state in the logical subspace given there was a distinguishable particle at the input, $\sigma_L$ is the normalised logical state in this case, $p_E$, $\sigma_E$ are the heralding probability and normalised state in the erasure subspace given there was a distinguishable particle and $\mathcal{N}$ is a normalization constant.

We find that $p_E=3/64$ and $p_L=3/16$ with $$\sigma_L = \frac{3}{8}(|\phi^+\rangle\langle\phi^+| + |\phi^-\rangle\langle\phi^-|) + \frac{1}{8}(|\psi^+\rangle\langle\psi^+| + |\psi^-\rangle\langle\psi^-|)$$

The Pauli error rate on the Bell state therefore goes as $\Pr(error) \sim 4\epsilon*5/8 = 2.5\epsilon$.

Importantly, the probability of heralding a state in the logical subspace is four times higher than heralding a state in the erasure space, and the logical state contains components of all possible Pauli errors.

In some embodiments, performing the T circuit after Bell generation we may obtain a new state which now has $p_E=9/64$ and $p_L=3/32$ and $$\sigma_L = \frac{1}{2}(|\phi^+\rangle\langle\phi^+| + |\phi^-\rangle\langle\phi^-|) \quad (7)$$

which results in $$Pr(\text{error}) \sim 4\epsilon * \frac{1}{2} * \frac{1}{2} = \epsilon.$$

Not only has the Pauli error rate been more than halved, but the state within the logical space has also been simplified, corresponding to a single Pauli error type occurring half the time. This logical state seems to be the best that may be achieved with only four input photons, since when one particle is distinguishable only three particle interference occurs, which may not produce dual-rail entanglement, and any states with $$\langle\phi^+|\rho|\phi^+\rangle > \frac{1}{2}$$

may be entangled.

One feature to note is that, as in the standard BSG, the resulting final state is independent of heralding pattern up to conditional operations. Although Eq. (4) seems to suggest that the technique will only work for the $|\phi^+\rangle$, detection outcomes (all other states would seem to get converted to erasure in the ideal case), since T also converts the state $|1100\rangle + |0011\rangle$, back to a $|\phi^-\rangle$, Bell state, detection patterns which previously corresponded to this encoding now lead to the same improved state (Eq. (6) with Eq. (7)) up to a known, local Z rotation. Similarly, a conditional modeswap can recover the improved state from the additional two detection patterns—the scheme therefore retains $p_{succ}=3/16$.

Finally, by using additional beam splitters on each qubit i.e. performing the transfer matrix H'=M(H⊕H)M(H⊕H) the Z error on the resulting Bell state can be exchanged for an X error:

$$\sigma_L = \frac{1}{2}(|\phi^+\rangle\langle\phi^+| + |\psi^+\rangle\langle\psi^+|) \quad (8)$$

which may improve GHZ state generation, as described in greater detail below.

Multiphoton Errors

In some embodiments, the conversion circuit reduces Pauli error introduced by the combination of multiphoton emission and loss. For example, by commuting all linear loss to the input, each photon entering the state generation circuit may be described to first order in $\epsilon_l$, which is 1 minus the total bundled efficiency (propagation loss, detector efficiency etc.), as:

$$\rho_{in} = \frac{1}{N}[(1-\epsilon_l)|1\rangle\langle1| + \epsilon_l|0\rangle\langle0| + 2\epsilon_l\epsilon_m|2\rangle\langle2| + O(\epsilon_l^2)] \quad (9)$$

where $\epsilon_m$ is the probability of producing two pairs from the source given that at least one pair was produced; $\epsilon_m = \text{sech}^2(r)\tanh^2(r)$ where r is the squeezing parameter.

Considering second-order errors in $\epsilon_l$ (since first-order errors may not result in logical states), the final logical state may be expressed as:

$$\rho_L = \frac{1}{N}\left[\frac{3}{16}\{1 - 4\epsilon_l(1 + 2\epsilon_m\epsilon_l) + 6\epsilon_l^2\}|\phi^+\rangle\langle\phi^+| + 12\epsilon_l^2\epsilon_m\epsilon p_L\sigma_L + O(\epsilon_l^3)\right]$$

We find that $p_L=3/16$ and $$\sigma_L = (|\phi^+\rangle, \langle\phi^+| + 11\sigma_{error})/12$$

resulting in $Pr(\text{error}) \sim 11\epsilon_l^2\epsilon_m$.

Applying the conversion circuit T results in a new state with $p_L=2/16$ and $$\sigma_L = (|\phi^+\rangle, \langle\phi^+| + 7\sigma_{error})/8$$

resulting in $Pr(\text{error}) \sim 7\epsilon_l^2\epsilon_m$, so a 36% improvement in Pauli error tolerance.

Figure 9:
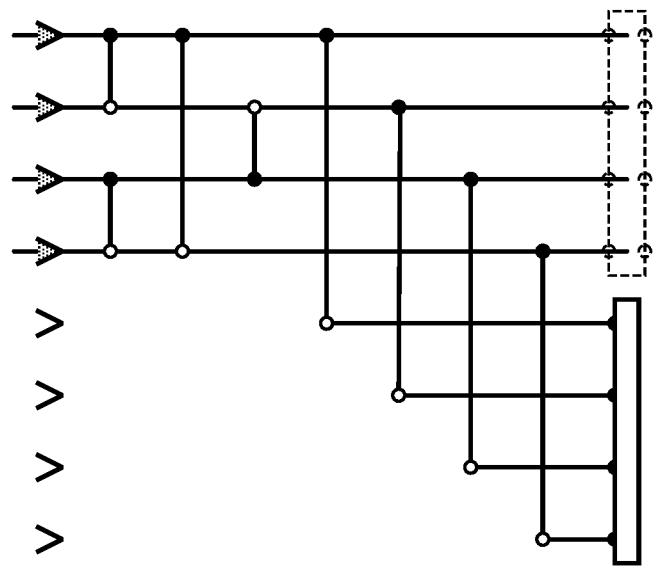
FIG. 9 is a circuit diagram of a reduced BSG, according to some embodiments.
Figure 10:
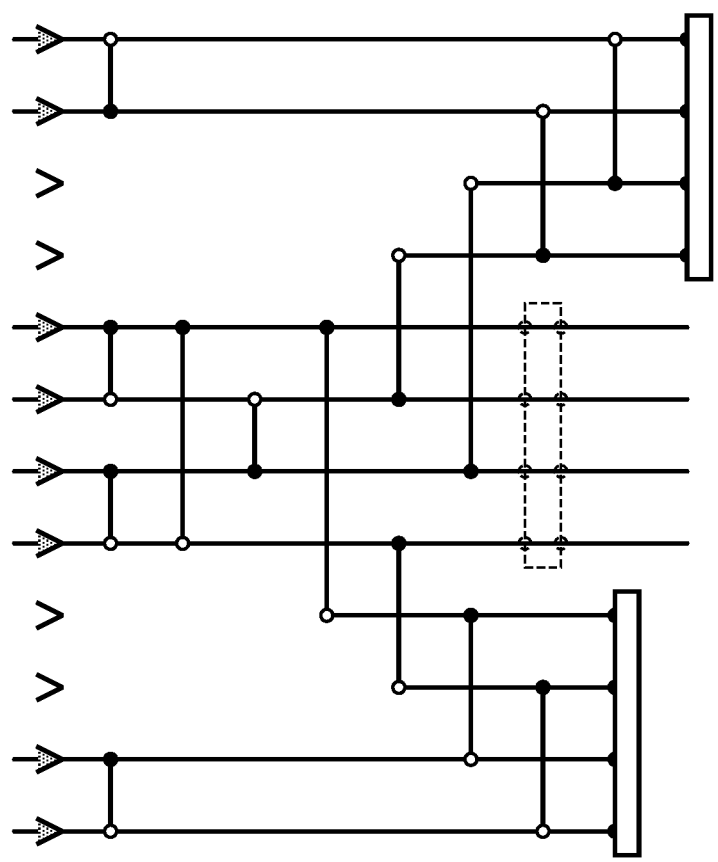
FIG. 10 is a circuit diagram of a boosted BSG scheme, according to some embodiments.
Figure 11:
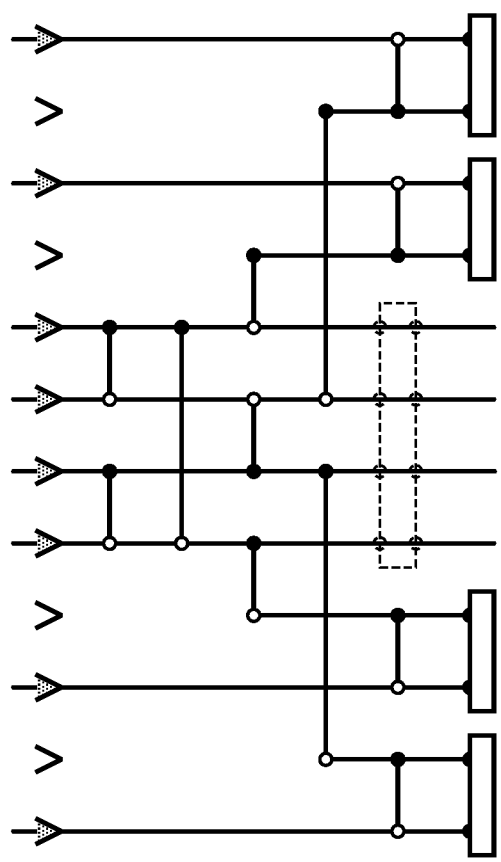
FIG. 11 is a circuit diagram of a BSG with the single mode detectors replaced with HOM-detectors, according to some embodiments.
Figure 12:
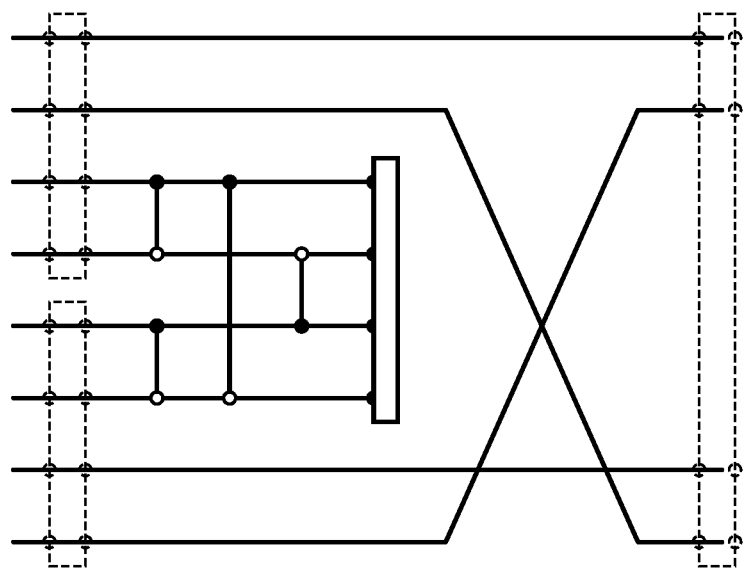
FIG. 12 is a circuit diagram illustrating a purification scheme, according to some embodiments.

FIGS. 9-11—Alternative BSG Circuits

In some embodiments, the standard BSG circuit followed by the conversion circuit H' may be compactly performed with fewer beam splitters via the circuit shown in FIG. 9. For example, it may be shown through properties of beam splitter operation that the circuit illustrated in FIG. 9 has an equivalent affect on the input quantum state as the more complex circuit illustrated in FIG. 8. FIG. 9 may therefore present a simpler means for accomplishing the same effect on the input quantum state as FIG. 8.

In some embodiments, a boosted BSG scheme may be used which utilizes additional ancilla photons to increase the probability of success of the Bell Generator circuit. FIG. 10 shows the circuit adapted to a form similar to FIG. 9. In these embodiments, the average state produced by this scheme has $Pr(\text{error}) \sim \epsilon$ for distinguishability errors independent of the number of ancilla photons injected (0, 2 or 4). However, in contrast to the regular case, the quality of the state may be dependent upon the specific detection pattern. For two ancillas there are three classes of inequivalent patterns which give rise to error rates $Pr(\text{error}) \sim \{0.833\epsilon, \epsilon, 1.5\epsilon\}$ and for four ancillas there are six classes of patterns which give rise to error rates $Pr(\text{error}) \sim \{0.666\epsilon, 0.833\epsilon, \epsilon, 1.333\epsilon, 1.5\epsilon, 2\epsilon\}$.

Given a supply of ancilla photons, as well as boosting the probability of success, the distinguishability tolerance of the BSG may also be increased by heralding on detection patterns that are more likely to occur when all the photons interfere perfectly. For instance, as illustrated in FIG. 11, each single mode detector may be replaced with a different type of detector which combines the mode with an ancilla photon on a beam splitter and clicks only when two bunched photons are detected, such as a Hong-Ou-Mandel (HOM)-detector.

If all four input photons to a BSG are detected in this way then $p_L$ and $p_E$ may be reduced by approximately one half, since at whichever detection mode the distinguishable particle ends up, it will only bunch half the time. These embodiments may then produce Bell states with a probability of 3/16 but with $Pr(\text{error}) \sim 0.5\epsilon$ (note that if only the heralding detectors are subject to HOM detection, then the advantage may only be realized half the time, so $Pr(\text{error}) \sim 0.75\epsilon$).

In some embodiments, this approach may generalize to the case where each detection mode is replaced with n photons and a n-dimensional Hadamard/DFT interferometer. This may lead to $Pr(\text{error}) \sim \epsilon/n$ behaviour.

Advantageously, and similar to the Boosted BSG method, the ancilla photon sources may be stochastic, with the more photons entering an interferometer at the detection modes the more confident we can be about the purity of the produced Bell state.

Entanglement Purification Via Fusion

In some embodiments, errors may be further suppressed via an entanglement purification scheme which fuses noisier Bell states to produce purer ones. For the case of distinguishability errors and using the conversion circuit H', the full logical-internal state produced, given a distinguishable particle was present in the input state, is:

$$\frac{1}{2}(|\phi^+\rangle\langle\phi^+| + |\psi^+\rangle\langle\psi^+|) \otimes \qquad (10)$$

$$\left[\frac{1}{2}|\Psi_0\Psi_0\rangle\langle\Psi_0\Psi_0| + \frac{1}{4}|\Psi_0\Psi_\perp\rangle\langle\Psi_0\Psi_\perp| + \frac{1}{4}|\Psi_\perp\Psi_0\rangle\langle\Psi_\perp\Psi_0|\right] + \text{coherences}$$

Note that Eq. (10) is similar to Eq. (8) without tracing out the internal state. The coherences may not be relevant since these photons may not interfere any further, and may be eventually detected by non-resolving detectors. The scheme simply takes two copies of this state and performs a Type-II fusion gate (using the rotated form with transfer matrix $F_{II}=(H\oplus H)M(H\oplus H)$) between a qubit from each, followed by a modeswap (e.g., see FIG. 12).

If both photons which enter the fusion gate are indistinguishable, when it succeeds it performs a projection onto $|\phi^+\rangle\langle\phi^+|$ (or $|\psi^+\rangle\langle\psi^+|$, which may be corrected for via an additional local unitary). If the two photons which enter the fusion gate are distinguishable, then the effective logical projection becomes $$\frac{1}{2}(|\phi^+\rangle\langle\phi^+| + |\psi^+\rangle\langle\psi^+|).$$

Applying these rules to the fusion between the state in Eq. (10) and an ideal Bell state, to first-order the resulting logical state may remain unchanged. However, all erasure terms have been filtered out, since they may result in the wrong number of photons entering the fusion gate. Accordingly, another mode swap M may convert all the $|\psi^+\rangle$ terms to the erasure subspace. The only error on the remaining state is then a Z error that is introduced by the swapping of a distinguishable particle:

$$\frac{3}{4}|\phi^+\rangle\langle\phi^+| \otimes |\Psi_0\Psi_0\rangle\langle\Psi_0\Psi_0| + \frac{1}{2}(|\phi^+\rangle\langle\phi^+| + |\phi^-\rangle\langle\phi^-|) \otimes \qquad (11)$$

$$\left[\frac{1}{4}|\Psi_0\Psi_\perp\rangle\langle\Psi_0\Psi_\perp| + \frac{1}{4}|\Psi_\perp\Psi_0\rangle\langle\Psi_\perp\Psi_0|\right] + \text{coherences}$$

and a resulting $\Pr(\text{error})\sim 0.25\epsilon$. Advantageously, this error is an order of magnitude less than that obtained using the standard BSG circuit. If Hadamard gates are then performed to convert the Z errors into X errors, the process may be repeated, reducing the error rate by a further factor of 2 each time. The above approach may be used within state generation circuits, such as those which use fusion of bell pairs to generate GHZ states, to achieve similar improvements without affecting the overall resource cost. One reason these approaches perform better is that in such schemes, mode swaps are performed between qubits which are not causally connected (e.g., because they were produced in different BSGs) and therefore, to first-order, they may not result in erasure being converted back to Pauli error.

Figure 13B:
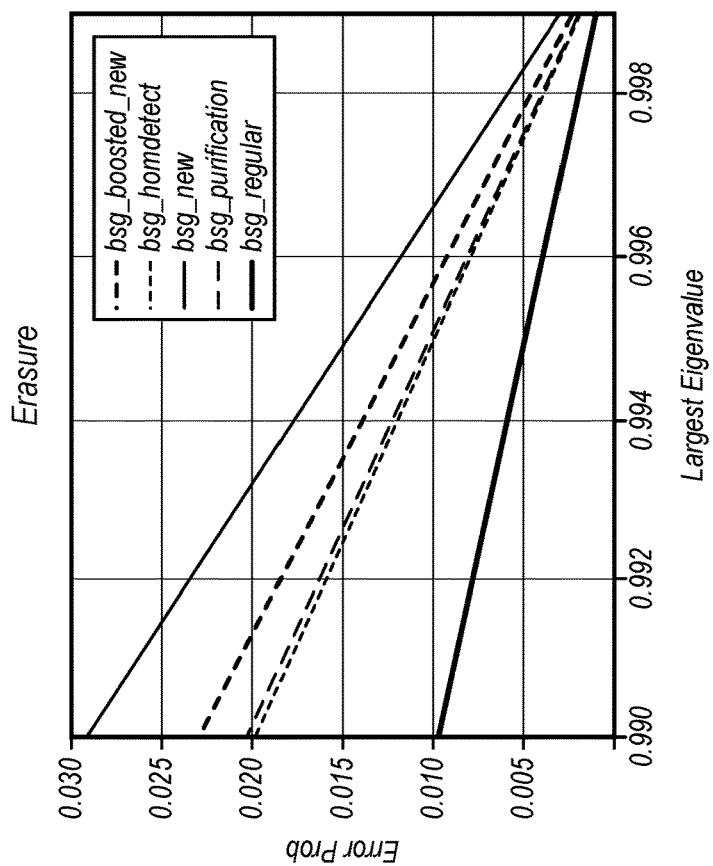
FIGS. 13A-B are graphs illustrating error probability for Pauli and erasure errors, according to some embodiments.
Figure 13A:
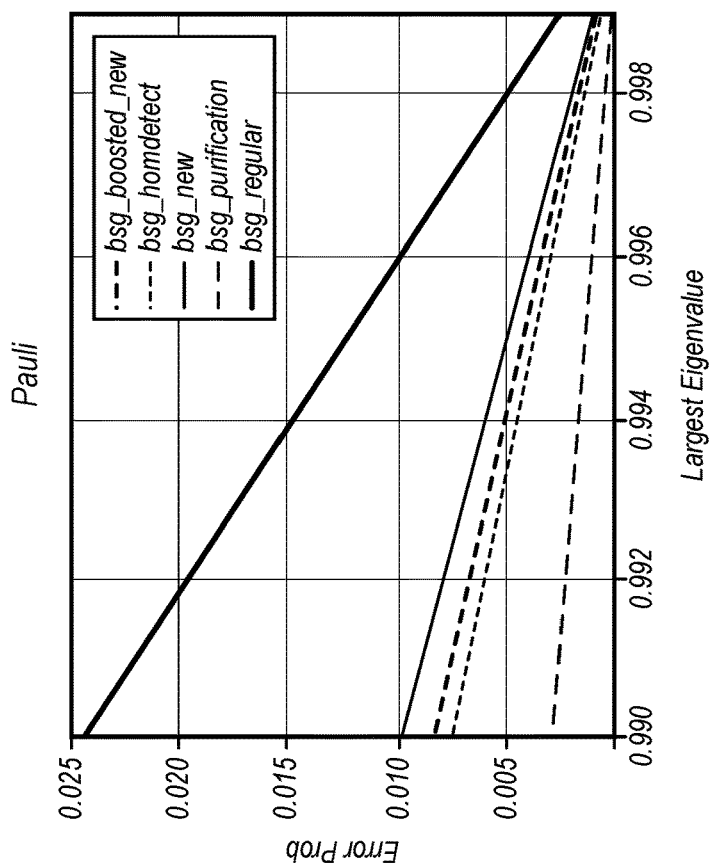

FIGS. 13A and 13B illustrate two graphs of error probabilities for Pauli and erasure errors, respectively, as a function of $1-\epsilon$ for different Bell generation schemes as discussed herein.

GHZ Generation

In some embodiments, generation of N-GHZ states with N>2 states, the 'full conversion' of Pauli errors to erasure errors that occur with the T matrix for N=2 may not occur. However, some embodiments may use N-1 mode swaps to convert all of the logical space states to the erasure subspace except $$\text{span}\left\{\frac{1}{\sqrt{2}}(|0\rangle^{\otimes n} + |1\rangle^{\otimes n}), \frac{1}{\sqrt{2}}(|0\rangle^{\otimes n} - |1\rangle^{\otimes n})\right\} \qquad (12)$$

i.e., the ideal GHZ state and a state with a single Z error on one qubit. Any configuration of mode swaps which results in every pair of qubit modes being comprised from different initial qubits may work for this purpose, in some embodiments.

Applying this scheme to distinguishability errors may result in the straightforward generalization of the Bell generator results. In other words, for an N qubit generator, applying the conversion may reduce the Pauli error rate from $\Pr(\text{error})\sim 1.25N\epsilon$ to $\Pr(\text{error})\sim 0.5N\epsilon$. In this case however, it may not be possible to exchange the Z for an X error.

In some embodiments, the N-GHZ states are prepared via an intermediate Bell generation stage. In these embodiments, error rates may be reduced via a similar mechanism as that explained above in reference to entanglement purification via fusion. Performing the standard circuit followed by modeswaps as before, the distinguishability error rate may be reduced by a factor of ten, from $\Pr(\text{error})\sim 2.5N\epsilon$ to $\Pr(\text{error})\sim 0.25N\epsilon$.

For embodiments which use one fewer Bell pair (e.g., N-1 Bell pairs), at the cost of losing some loss tolerance, a similar relationship may occur with more favorable error rates due to the reduced resources required; $\Pr(\text{error})\sim 2.5(N-1)\Sigma$ (for N>2) without conversion and $\Pr(\text{error})\sim 0.25(N-1)\epsilon$ with it.

In some embodiments, a 6-GHZ state may be generated from a 4 Bell pair scheme. In these embodiments, error improvement may be obtained from $\Pr(\text{error})\sim 10.5\epsilon$ to $\Pr(\text{error})\sim 0.875\epsilon$, which is close to the $\Pr(\text{error})\sim 0.125N\epsilon$ scaling implied by the purification scheme.

The embodiments described above for generating NGHZ states obtain a simple distinguishability error model consisting of just a single Z error on one qubit, correlated with there being a distinguishable particle in the state. When converting these states to star clusters, in some embodiments the error may be considered to occur on the central qubit. Accordingly, if the LPP involves just fusions between the dangling bonds of these states, the final error rate on a qubit in the lattice may be approximately $$\frac{1}{2} \times \text{cluster state valence} \times \text{ghz error rate}$$

Note that the factor of ½ is present in this estimate because the choice of where to do the local pre-fusion rotations may determine whether the errors spread to other lattice sites, which may happen half the time, on average.

Figure 14A:
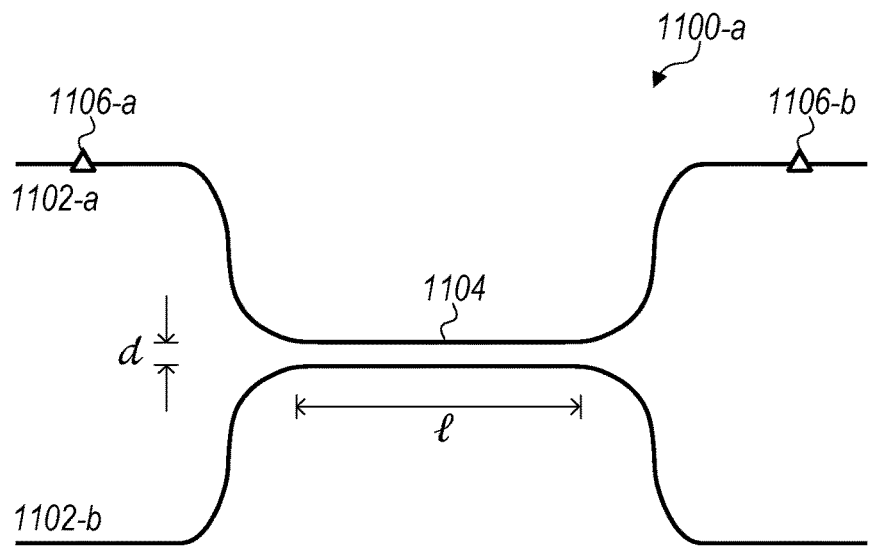
FIGS. 14A-C show photonic implementations of beam splitters that may be used to implement one or more Hadamard gates, according to some embodiments.
Figure 14B:
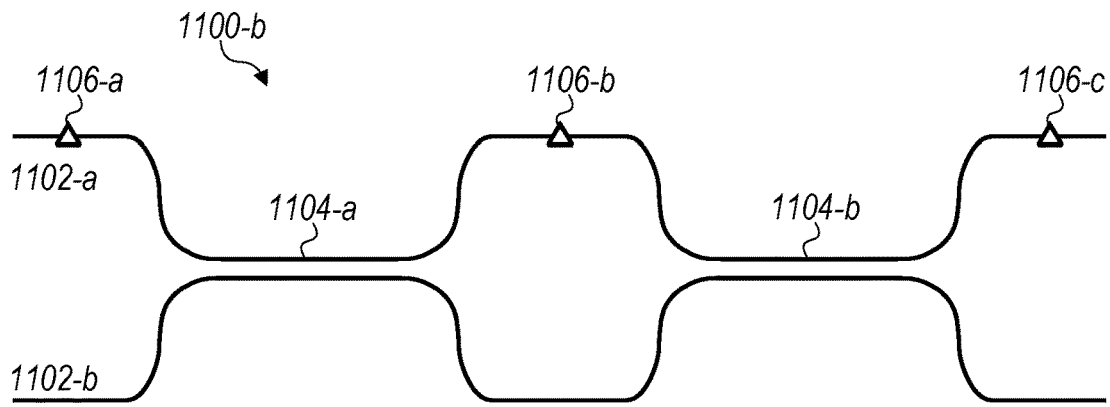
Figure 14C:
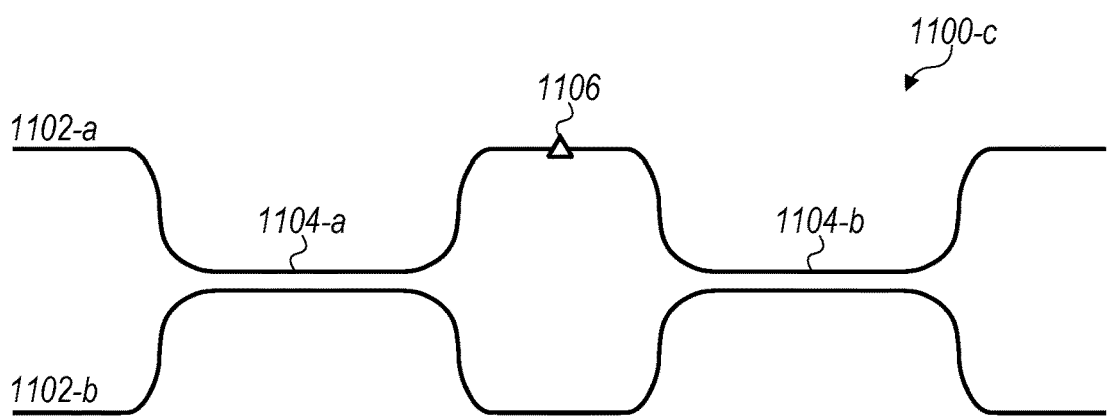

FIGS. 14A-14C illustrate schematic diagram of waveguide beam splitter 1100 (e.g., 1100-a, 1100-b, and 1100-c, respectively), in accordance with some embodiments. In some embodiments, beam splitters are implemented in integrated photonics via directional couplers, which are realized by bringing together the different waveguides (e.g., waveguides 1102-*a* and 1102-*b*) close enough so that the evanescent field of one of them may couple into the other one. By controlling the separation d between the waveguides 1102 and/or the length l of the coupling region 1104, different transmissivity may be obtained and therefore this implementation is equivalent to a beam-splitter in bulk optics. In this manner, wave guide beam splitter 1100 may be configured to have a transmissivity equal to 0.5 (i.e., a 50/50 beam splitter, greater than 0.6, greater than 0.7, greater than 0.8, or greater than 0.9).

In some embodiments, waveguide beam splitters 1100 include variable phase-shifters 1106. Variable phase-shifters may be implemented in integrated circuits, providing control over the relative phases of the state of a photon spread over multiple modes. For the silica-on-silicon materials some embodiments implement variable phase-shifters using thermo-optical switches. The thermo-optical switches use resistive elements fabricated on the surface of the chip, that via the thermo-optical effect may provide a change of the refractive index n by raising the temperature of the waveguide 1102 by an amount of the order of $10^{-5}$ K. One of skill in the art, however, having had the benefit of this disclosure, will understand that any effect that changes the refractive index of a portion of the waveguide may be used to generate a variable, electrically tunable, phase shift. For example, some embodiments use beam splitters based on any material that supports an electro-optic effect, so-called $\chi^2$ and $\chi^3$ materials such as lithium niobite, BBO, KTP, and the like and even doped semiconductors such as silicon, germanium, and the like.

Beam-splitters with variable transmissivity and arbitrary phase relationships between output modes may also be achieved by combining directional couplers and variable phase-shifters in a Mach-Zehnder Interferometer (MZI) configuration, e.g., as shown in FIG. 14B. Complete control over the relative phase and amplitude of the two paths in dual rail encoding may be achieved by varying the phases imparted by phase shifters 1106-*a*, 1106-*b*, and 1106-*c*. FIG. 14C shows a slightly simpler example of a MZI that allows for a variable transmissivity between modes 1102-*a* and 1102-*b* by varying the phase imparted by the phase shifter 1106. FIGS. 14A-14C are only three examples of how one could implement a mode coupler in a physical device, but any type of mode coupler/beam splitter may be used without departing from the scope of the present disclosure.

For example, the waveguide beam splitter in FIG. 14C may be used to switch photons in mode 1102-*a* into either mode 1102-*a* or 1102-*b* by adjusting the phase of phase shifter 1106-*b* appropriately. Thus, a tunable waveguide beam splitter is a device for mode swapping and optical switching. In addition, these beam splitters, e.g., in a 50/50 configuration may be used to spread the quantum state of a single photon equally across multiple modes (waveguides) thereby providing a means to implement the Hadamard operations described above. One of ordinary skill will appreciate that there are many other different ways to implement a Hadamard based on photonic beam splitters without departing from the scope of the present disclosure.

APPENDIX—ALTERNATIVE SEQUENCES OF LINEAR OPTICAL OPERATIONS

The transfer matrix T described above in reference to FIG. 6 describes a particular embodiment where the sequence of linear optical operations leaves the Bell state $|\Phi^+\rangle$ invariant, while transforming the remaining three Bell states into the erasure subspace. However, the scope of the instant disclosure also includes embodiments where the dual rail photonic qubit is initially prepared in one of the other Bell states (e.g., $|\Phi^-\rangle$, $|\Psi^+\rangle$, and $|\Psi^-\rangle$) and a sequence of linear optical operations is performed which leaves this initial Bell state invariant, while transforming the other Bell states into the erasure subspace. This Appendix presents explicit transformation matrices and the associated linear optical circuitry to accomplish each of these transformations.

FIGS. 15A-D—Bell State P-E Conversion Circuits

For each Bell state, the transfer matrices illustrated in FIGS. 15A-D represent the unitary transformations of four modes which perform the Pauli-Erasure conversion. Each transfer matrix in FIGS. 15A-D is illustrated next to a corresponding circuit diagram decomposition of beamsplitters and n-phase shifters.

FIG. 15E—GHZ P-E conversion circuits

The scheme for GHZ states may consist of swapping all the incoming modes corresponding to |0⟩ or |1⟩ such that each new qubit is comprised of modes from different initial qubits. For example, for a 3 GHZ state, either of the circuit diagrams illustrated in FIG. 15E may serve for this purpose.

Figure 15F:
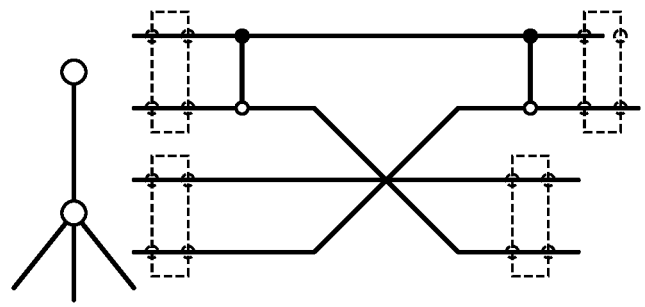
Figure 15G:
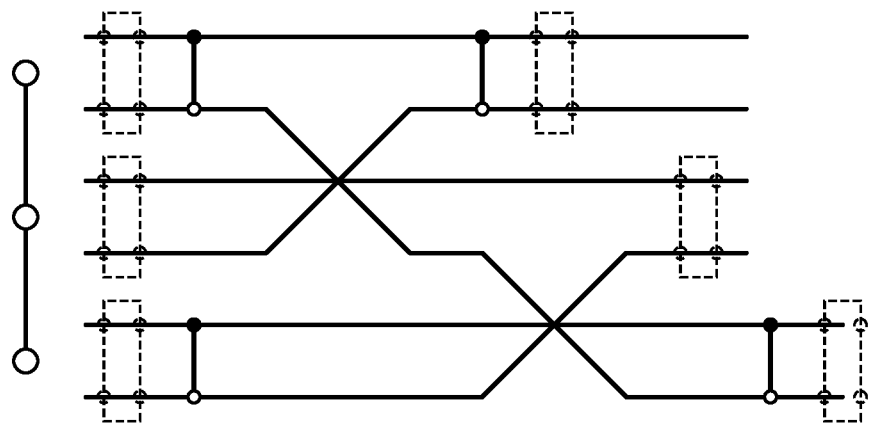

FIGS. 15F-G—Graph State P-E Conversion Circuits

FIG. 15F illustrates a conversion circuit that may be used on a general graph state, anywhere in which the tree structure illustrates in FIG. 15F appears. For example, for a three qubit linear graph, FIG. 15G illustrates a circuit that may accomplish this purpose.

Figure 15I:
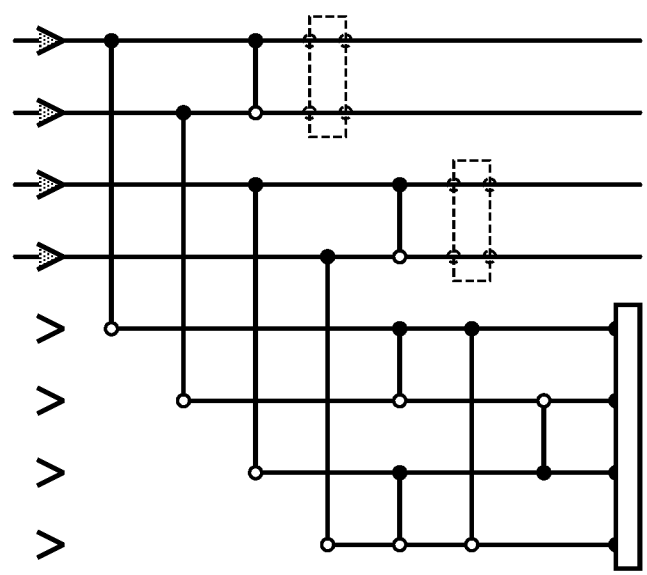

FIG. 15H-J Bell State Generator Circuits

FIG. 15H illustrates a standard BSG circuit and its corresponding transfer matrix.

It may be shown that two beamsplitters may be added to the output of this circuit and the state that is generated remains unchanged, as illustrated in FIG. 15I. If a P-E converter is then applied on the output modes, we may obtain the circuit which is illustrated in FIG. 15J, along with its corresponding transfer matrix.

Figure 15K:
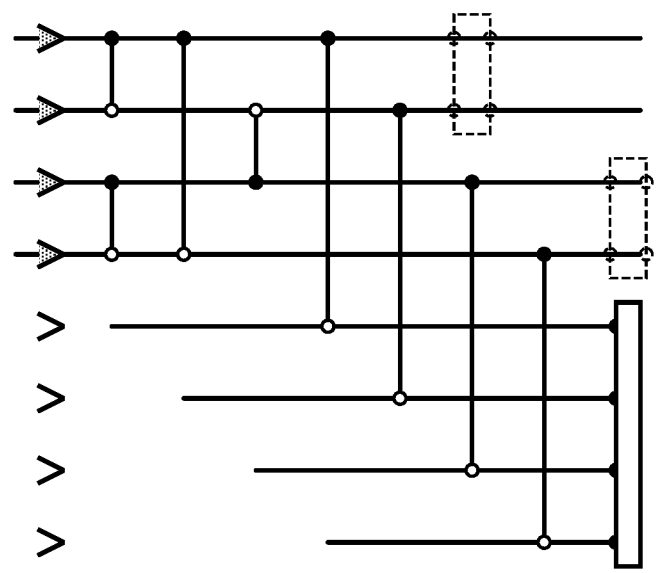

Using circuit rearrangement identities, it is possible to show that the circuit illustrated in FIG. 15K shares the same transfer matrix, $T_{bsg\_conversion}$, as that corresponding to the circuit illustrated in FIG. 15J. Further, the circuit illustrated in FIG. 15K may be preferred in some circumstances due to its lower beamsplitter circuit depth).

The terminology used in the description of the various described embodiments herein is for the purpose of describing particular embodiments only and is not intended to be limiting. As used in the description of the various described embodiments and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that, although the terms first, second, etc., are, in some instances, used herein to describe various elements, these elements should not be limited by these terms. These terms are only used to distinguish one element from another. For example, a first switch could be termed a second switch, and, similarly, a second switch could be termed a first switch, without departing from the scope of the various described embodiments. The first switch and the second switch are both switches, but they are not the same switch unless explicitly stated as such.

As used herein, the term "if" is, optionally, construed to mean "when" or "upon" or "in response to determining" or "in response to detecting" or "in accordance with a determination that," depending on the context.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method, comprising:
   receiving, by a quantum computing system, two or more qubits, wherein at least one first qubit of the two or more qubits has experienced a Pauli error within a logical subspace of a Fock space;
   performing, by the quantum computing system, a sequence of operations on the two or more qubits to generate two or more modified qubits, wherein the sequence of operations transforms one or more of the first qubits from the logical subspace of the Fock space to an erasure subspace of the Fock space, and wherein the sequence of operations transforms the Pauli error to an erasure error in the erasure subspace.

2. The method of claim 1, the method further comprising:
   generating a quantum cluster state based at least in part on the two or more modified qubits.

3. The method of claim 2, the method further comprising:
   performing a quantum computational algorithm using the quantum cluster state.

4. The method of claim 1,
   wherein the sequence of operations leaves invariant one or more second qubits of the two or more qubits that have not experienced a Pauli error, wherein the one or more second qubits are comprised within the logical subspace of the Fock space.

5. The method of claim 1,
   wherein the two or more qubits are three or more qubits comprised within Greenberger-Horne-Zeilinger (GHZ) states;
   wherein the three or more qubits further comprise a second qubit that has experienced a single Z error, wherein the second qubit is unaffected by the sequence of operations.

6. The method of claim 1, the method further comprising:
   extracting classical information from the two or more modified qubits, wherein the classical information identifies one or more of the two or more modified qubits comprised within the erasure subspace; and
   identifying the one or more modified qubits comprised within the erasure subspace as lost in a subsequent generation of a quantum cluster state.

7. The method of claim 1,
   wherein the two or more qubits comprise two or more dual-rail photonic qubits.

8. The method of claim 1,
   wherein the sequence of operations comprises a sequence of linear optical circuitry operations.

9. The method of claim 1,
   wherein the two or more qubits consist of two qubits, and
   wherein the sequence of operations comprises an ordered sequence of a first mode swap, a beam splitter, and a second mode swap.

10. The method of claim 1,
    wherein the two or more qubits consist of three qubits, and
    wherein the sequence of operations consists of an ordered sequence of mode swaps.

11. The method of claim 1,
    wherein the two or more qubits are comprised within Bell states, the method further comprising:
    generating the two or more qubits by utilizing a boosted Bell state generator (BSG) scheme, wherein the boosted BSG scheme uses additional ancilla photons to reduce the prevalence of error in the generated two or more qubits.

12. A photonic quantum computing device, comprising:
    one or more sets of waveguides, wherein each set of waveguides of the one or more sets of waveguides includes two or more waveguides;
    one or more sets of beam splitters that couple the respective waveguides of each set of waveguides of the one or more sets of waveguides to produce a photonic state comprising a plurality of photonic qubits within the one or more sets of waveguides;
    a controller configured to:
       produce the photonic state by utilizing the one or more sets of beam splitters, wherein one or more first photonic qubits of the photonic state has experienced a Pauli error within a logical subspace of a Fock space in its generation;
       perform a sequence of operations on the photonic state to generate a modified photonic state, wherein the sequence of operations transforms the one or more first photonic qubits of the photonic state from the logical subspace of the Fock space to an erasure subspace of the Fock space, and wherein the sequence of operations transforms the Pauli error to an erasure error in the erasure subspace.

13. The photonic quantum computing device of claim 12, wherein the controller is further configured to:
    generate a quantum cluster state based at least in part on the modified photonic state; and
    perform a quantum computational algorithm using the quantum cluster state.

14. The photonic quantum computing device of claim 12,
    wherein the sequence of operations leaves invariant one or more second photonic qubits of the photonic state that have not experienced a Pauli error, wherein the one or more second photonic qubits are comprised within the logical subspace of the Fock space.

15. The photonic quantum computing device of claim 12,
    wherein the plurality of photonic qubits are comprised within Greenberger-Horne-Zeilinger (GHZ) states;
    wherein the photonic state further comprises a second photonic qubit that has experienced a single Z error, wherein the second photonic qubits is unaffected by the sequence of operations.

16. The photonic quantum computing device of claim 12,
    wherein the plurality of photonic qubits consists of two photonic qubits, and wherein the sequence of operations comprises an ordered sequence of a first mode swap, a beam splitter, and a second mode swap.

17. The photonic quantum computing device of claim 12, wherein the plurality of photonic qubits consists of three photonic qubits, and
wherein the sequence of operations consists of an ordered sequence of mode swaps.

18. A photonic quantum computing system, comprising:
a plurality of modes, wherein each mode is configured to be occupied by one or more photonic qubits;
a plurality of mode couplers that couple respective modes of the plurality of modes to produce a photonic state for the plurality of modes; and
a controller configured to:
    input one or more respective photonic qubits into each mode of the plurality of modes;
    couple respective modes of the plurality of modes using the plurality of mode couplers to produce the photonic state, wherein at least one first photonic qubit of the photonic state has experienced a Pauli error within a logical subspace of a Fock space;
    perform a sequence of operations on the photonic state to generate a modified photonic state, wherein the sequence of operations transforms the at least one first photonic qubit from the logical subspace of the Fock space to an erasure subspace of the Fock space, and wherein the sequence of operations transforms the Pauli error to an erasure error in the erasure subspace;
    generate a quantum cluster state based at least in part on the modified photonic state; and
    perform a quantum computational algorithm using the quantum cluster state.

19. The photonic quantum computing system of claim 18, wherein the controller is further configured to:
    extract classical information from the modified photonic state, wherein the classical information identifies one or more photonic qubits comprised within the erasure subspace; and
    identify the one or more photonic qubits comprised within the erasure subspace as lost in a subsequent generation of a quantum cluster state.

20. The photonic quantum computing system of claim 18, wherein the photonic state comprises two or more dual-rail photonic qubits.

21. The photonic quantum computing system of claim 18, wherein the photonic state is a Bell state, and wherein the controller is further configured to:
produce the one or more photonic qubits by utilizing a boosted Bell state generator (BSG) scheme, wherein the boosted BSG scheme uses additional ancilla photons to reduce the prevalence of error in the produced one or more photonic qubits.

* * * * *